United States Patent
Sasaki et al.

(10) Patent No.: US 7,524,774 B2
(45) Date of Patent: Apr. 28, 2009

(54) MANUFACTURING METHOD OF SEMICONDUCTOR DEVICE, SEMICONDUCTOR MANUFACTURING APPARATUS, PLASMA NITRIDATION METHOD, COMPUTER RECORDING MEDIUM, AND PROGRAM

(75) Inventors: Masaru Sasaki, Amagasaki (JP); Yoshiro Kabe, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 75 days.

(21) Appl. No.: 11/388,990

(22) Filed: Mar. 27, 2006

(65) Prior Publication Data

US 2006/0166446 A1 Jul. 27, 2006

Related U.S. Application Data

(63) Continuation-in-part of application No. PCT/JP2004/013823, filed on Sep. 22, 2004.

(30) Foreign Application Priority Data

Sep. 26, 2003 (JP) ............................ 2003-334479
Jun. 27, 2005 (JP) ............................ 2005-186526

(51) Int. Cl.
  *H01L 21/469* (2006.01)
  *H01L 21/26* (2006.01)

(52) U.S. Cl. .................... 438/775; 438/238; 438/381; 257/E21.17; 257/E21.051; 257/E21.311; 257/E21.396; 257/E21.655

(58) Field of Classification Search .............. 438/775, 438/197, 238, 381, 270, 700, 513, 647, 648, 438/657, 663, 676, 680

See application file for complete search history.

(56) References Cited

U.S. PATENT DOCUMENTS

| | | | | |
|---|---|---|---|---|
| 5,851,870 A | * | 12/1998 | Alugbin et al. | 438/239 |
| 5,912,797 A | * | 6/1999 | Schneemeyer et al. | 361/311 |
| 6,156,121 A | * | 12/2000 | Hasebe et al. | 118/500 |
| 6,265,260 B1 | * | 7/2001 | Alers et al. | 438/240 |
| 6,344,387 B1 | * | 2/2002 | Hasebe et al. | 438/240 |
| 6,461,957 B1 | * | 10/2002 | Yokoyama et al. | 438/622 |
| 6,613,669 B2 | | 9/2003 | Taguwa | |
| 6,677,230 B2 | * | 1/2004 | Yokoyama et al. | 438/620 |
| 2001/0006826 A1 | | 7/2001 | Lee | |
| 2001/0046789 A1 | | 11/2001 | Taguwa | |
| 2003/0205818 A1 | | 11/2003 | Taguwa | |

FOREIGN PATENT DOCUMENTS

EP  1 020 901  7/2000

(Continued)

*Primary Examiner*—David Nhu
(74) *Attorney, Agent, or Firm*—Oblon, Spivak, McClelland, Maier & Neustadt, P.C.

(57) ABSTRACT

An object of the present invention is to prevent an increase in film thickness and inhibit a reduction in capacity of a capacitor. In a semiconductor device having a capacitor, the capacitor includes a lower electrode, an upper electrode, and an insulating film interposed between the lower electrode and the upper electrode. A surface of the lower electrode on an insulating layer side is nitrided. If the lower electrode is made of polysilicon, nitriding the surface thereof increases oxidation resistance at the time of heat treatment in a post process. Particularly in a DRAM, the capacity of the capacitor is large, and therefore, this effect is significant. Further, leakage current inside the capacitor is also reduced.

11 Claims, 21 Drawing Sheets

FOREIGN PATENT DOCUMENTS

| | | |
|---|---|---|
| JP | 2000-208744 | 7/2000 |
| JP | 2001-257327 | 9/2001 |
| JP | 2003-092361 | 3/2003 |
| JP | 2003-124348 | 4/2003 |
| WO | 2005-031869 | 4/2005 |

* cited by examiner

US 7,524,774 B2

MANUFACTURING METHOD OF SEMICONDUCTOR DEVICE, SEMICONDUCTOR MANUFACTURING APPARATUS, PLASMA NITRIDATION METHOD, COMPUTER RECORDING MEDIUM, AND PROGRAM

This is a continuation in part of PCT Application No. PCT/JP2004/013823, file on Sep. 22, 2004, which claims the benefit of a Japanese Patent Application No. 2003-334479, filed on Sep. 26, 2003, all of which are incorporated herein by reference.

BACKGROUND OF THE INVENTION

1. Field of the Invention

The present invention relates to a manufacturing method of a semiconductor device, a semiconductor manufacturing apparatus, a plasma nitridation method, a computer recording medium, and a program.

2. Description of the Related Art

A DRAM as a semiconductor device has, in its memory cell, a MOS transistor and a capacitor storing charges for memory. In recent years, in accordance with the miniaturization of a semiconductor device, size shrinkage of the transistor and the capacitor in the semiconductor device is being demanded. Since the capacity of a capacitor is proportional to its area and inversely proportional to its thickness, there is a limit to reduction in thickness of the capacitor.

The structures often adopted as a capacitor are a MIM (Metal Insulator Metal) structure and a MIS (Metal Insulator Semiconductor) structure. For a semiconductor layer (lower electrode) of the MIS structure, used is, for example, polysilicon.

Processes for forming the above-described capacitor structure includes a heat treatment process after the lower electrode of polysilicon or the like and a capacitive film are formed. When heat-treated, a $SiO_2$ layer is formed on the polysilicon electrode since its surface oxidizes. As a result, an apparent dielectric constant of an insulating film constituting the capacitor lowers, resulting in a reduced capacity.

On the other hand, for a peripheral circuit of a logic device, titanium nitride (TiN) is sometimes used instead of the lower electrode made of a polysilicon material. When the titanium nitride as the lower electrode of the capacitor is heat-treated, its surface oxidizes similarly to polysilicon. As a result, TiO is formed, which increases conductor resistance. Or, a problem occurred that an apparent thickness of the insulating film constituting the capacitor increased, resulting in a reduced capacity.

Japanese Patent Application Laid-open No. 2001-274148 discloses a method of forming a silicon nitride film on a silicon oxide film by plasma processing.

Manufacturing of various kinds of semiconductor devices includes a silicon nitridation step of applying nitridation processing to polysilicon functioning as an electrode. Manufacture of, for example, a MIS (Metal Insulator Silicon) capacitor incorporated in a DRAM (Dynamic Random Access Memory) includes, before the step of forming a high-k film (high dielectric constant film), the step of nitriding polysilicon being a lower electrode to form a silicon nitride film for the purpose of improving oxidation resistance. This aims at nitriding a surface of the polysilicon beforehand because capacitance decreases if at the time of annealing the high-k film for reformation and crystallization, the surface of the polysilicon electrode as its base oxidizes.

For forming the silicon nitride film in manufacture of the aforesaid MIS capacitor and the like, a thermal nitridation method such as RTN (Rapid Thermal Nitridation) has been conventionally adopted (Japanese Patent Application Laid-open No. Hei 7-221201). The thermal nitridation method, however, causes thermal damage to a film such as deterioration of a gate insulating film since processing by this method at high process temperature of 800° C. to 1100° C. in a $NH_3$ gas atmosphere makes it difficult to control a nitridation amount of polysilicon. Therefore, in recent years, there has been an increasing demand for low-temperature film deposition for the purpose of alleviating thermal load, and a plasma nitridation method using a plasma and capable of low-temperature processing has been proposed in place of the thermal nitridation method (Japanese Patent Application Laid-open No. 2004-214655).

SUMMARY OF THE INVENTION

The nitridation processing using the plasma disclosed in Japanese Patent Application Laid-open No. 2004-214655 can solve many of the problems of the thermal nitridation processing since it is capable of low-temperature (for example, about 400° to about 500° C.) processing. However, the plasma processing disclosed in Japanese Patent Application Laid-open No. 2004-214655 has a unique problem of its own that it is difficult to form a uniform nitride film, depending on the shape of silicon on a surface of a processing target. For example, in a DRAM, an electrode area of a capacitor is sometimes increased by adopting, for example, a trench structure. This is intended for satisfying a demand for a larger electrode area in order to increase an amount of charges stored in a capacitor as well as a demand for smaller memory cells in order to realize higher integration degree to obtain a larger memory capacity. A capacitor with such a trench structure requires very deep trenches with a high height-to-width aspect ratio in order to ensure that a sufficient amount of charges is stored.

However, there has been a problem that a higher aspect ratio of the trench causes a greater difference in nitridation degree among portions of the trench, for example, between an upper portion and a lower portion (near a bottom of the trench), when a polysilicon electrode is plasma-nitrided in the course of manufacturing a MIS capacitor with the trench structure. A possible cause of this problem may be that nitrogen radicals and nitrogen ions which are active species become inactive before reaching the bottom of the trench with the high aspect ratio.

The present invention was made in consideration of the above-described circumstances, and an object thereof is to provide a manufacturing method of a semiconductor device and a semiconductor device in which increase in film thickness and reduction in capacity of a capacitor can be inhibited. It is another object of the present invention to apply uniform nitridation processing using a plasma to polysilicon having a trench structure with a high aspect ratio.

In order to attain the objects stated above, the present invention is a manufacturing method of a semiconductor device including the steps of: forming a lower electrode for a capacitor on a semiconductor substrate; nitriding a surface of the lower electrode; forming an insulating film on the lower electrode; and forming an upper electrode on the insulating film.

According to another aspect, the present invention is an apparatus used in manufacturing steps of a capacitor having an upper electrode, a lower electrode, and an insulating film formed between these electrodes, the apparatus including: a process vessel housing a semiconductor substrate to be processed; a gas supply means for supplying gas appropriate for processing into the process vessel; and a microwave supply means for supplying a microwave into the process vessel in order to excite a plasma. Further, in order to form a nitride film on a surface of the lower electrode, the gas supply means supplies nitrogen gas into the process vessel after the semiconductor substrate on which the lower electrode is formed is loaded in the process vessel.

In each of the aspects of the present invention, if the lower electrode is made of polysilicon, nitriding its surface improves oxidation resistance at the time of heat treatment in a post process. Generally, since the capacity of a capacitor is large in a DRAM, applying the present invention to a capacitor of a DRAM makes the effect more prominent.

Further, if titanium nitride is used as the lower electrode, a surface of the titanium nitride is further nitrided, so that a nitrogen-rich layer is formed. This improves oxidation resistance at the time of heat treatment in a post process, similarly to the case of the polysilicon lower electrode.

The steps of forming a lower electrode for a capacitor on a semiconductor substrate, nitriding a surface of the lower electrode, forming an insulating film on the lower electrode, and forming an upper electrode on the insulating film are carried out in, for example, a semiconductor manufacturing apparatus. These steps are executed by a computer controlling the semiconductor manufacturing apparatus based on software that a computer recording medium has.

In the present invention, nitridation processing is applied to a surface of a lower electrode of a capacitor, so that not only oxidation resistance is improved but also leakage current in the capacitor is reduced. As a result, an apparent dielectric constant is prevented from lowering and the thickness of an insulating film is allowed to be thick.

According to still another aspect, the present invention is a plasma nitridation method of nitriding a polysilicon film exposed on a surface of a processing target, by a nitrogen-containing plasma, wherein plasma nitridation processing is applied to the polysilicon film by a plasma processing apparatus that generates the plasma by introducing a microwave into a process chamber, using a plane antenna having a plurality of slots, and wherein the plasma nitridation processing is applied under process pressure of 66.7 Pa to 1333 Pa and process temperature of 250° C. to 800° C. In this case, the process pressure is preferably 133.3 Pa to 666.5 Pa.

The nitrogen-containing plasma may contain at least 5% nitrogen or more. The nitrogen-containing plasma may be a plasma generated by gas that contains nitrogen gas and rare gas. A thickness of a nitride film formed on the polysilicon film is preferably 0.5 nm to 3 nm.

The polysilicon film on the surface of the processing target may have a shape with a recessed portion. In this case, a ratio of a depth and an opening width (depth/opening width) of the recessed portion is preferably 1 to 50. The polysilicon film may be a lower electrode of, for example, a MIS capacitor.

According to the plasma nitridation method of the present invention, in particular, even in a case of the shape having the recessed portion with a high aspect ratio, it is possible to eliminate variation in thickness of the formed nitride film to improve uniformity in thickness of the nitride film in a semiconductor wafer surface. Further, by controlling the process pressure by a RLSA-type plasma processing apparatus, it is possible to control a ratio of active species in the plasma, for example, radicals and ions. For example, on a high-pressure side, an ion ratio is low and a radical ratio is high. That is, it can be thought that on the high-pressure side, high-density radicals are generated, and thus the radicals being the active species can reach bottoms of the recessed portions to realize uniform nitridation of the whole recessed portions. When the radicals once collide with walls in the recessed portions such as trench holes and the nitride film is formed, a nitridation reaction probability of subsequently supplied radicals gets lower in surface portions of the nitride film, and the radicals can be made to reach the bottoms of the recessed portions by high pressure and the supply of a large amount of the radicals. Thus, on the high pressure side, plasma ion energy moderately works because it is damped. This makes it possible to form a uniform nitride film even in the recessed portion with a high aspect ratio while reducing damage to a film and a substrate.

Further, in a case where a target of the plasma nitridation processing is a polysilicon film as a lower electrode of a MIS capacitor with a trench structure, if the nitridation processing is applied to its surface beforehand, the oxidation of the surface of the polysilicon electrode is inhibited at the time of annealing for reformation and crystallization of a high dielectric constant film (high-k film), resulting in improved oxidation resistance. Therefore, reduction in capacitance can be surely prevented, so that it is possible to provide a semiconductor device such as a DRAM superior in electric property.

The above-described plasma nitridation method of the present invention can be configured as, for example, a program that runs on a computer to control a plasma processing apparatus, and this program can be stored in a computer recording medium.

DETAILED DESCRIPTION OF THE INVENTION

Hereinafter, the present invention will be described, taking manufacture of a capacitor in a DRAM as an example. Each of a plurality memory cells forming the DRAM has a structure including one MOS transistor, one capacitor, and element isolating regions. The MOS transistor includes, for example, N-doped source electrode and drain electrode on a P-type silicon substrate, a gate insulating film, and a gate electrode. The drain electrode is connected to a bit line. The gate electrode is connected to a word line. A protective oxide film is formed around the gate electrode portion.

Figure 1:
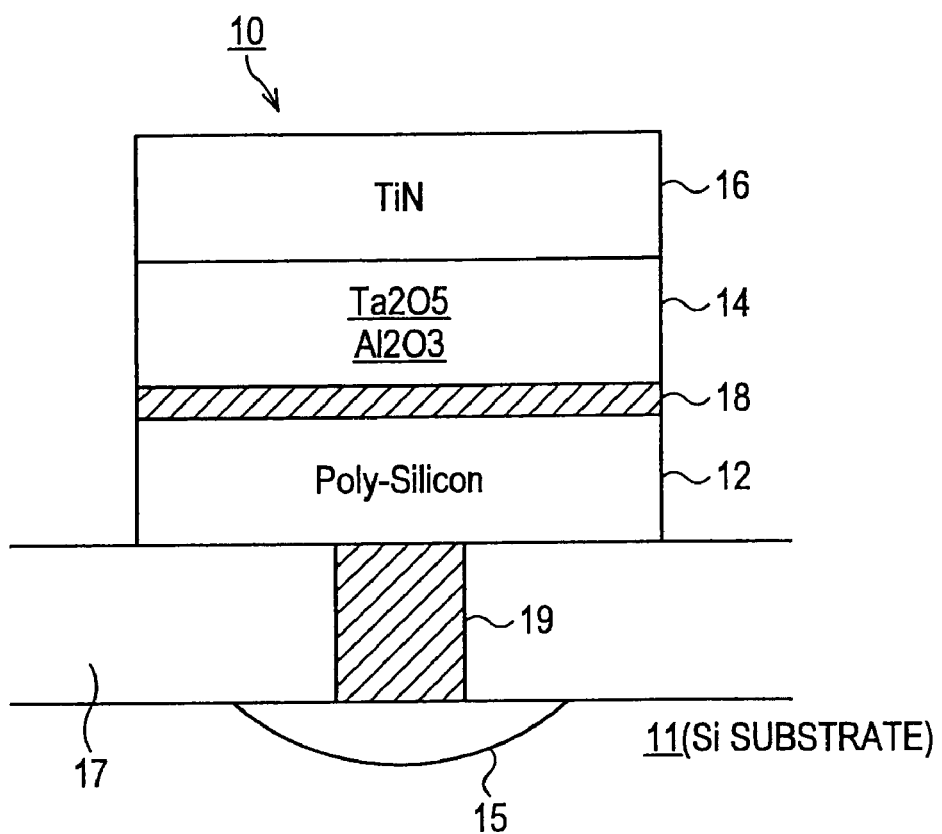
FIG. 1 is an explanatory view of a cross section showing a structure of a capacitor according to a first embodiment.

FIG. 1 shows a structure of a capacitor 10 according to a first embodiment. The capacitor 10 includes an interlayer insulating film 17 formed on a silicon substrate 11, a lower electrode 12 formed on the interlayer insulating film 17, an insulating film 14 formed on the lower electrode 12, and an upper electrode layer 16 formed on the insulating film 14. The upper electrode layer 16 is a metal layer of TiN or the like, and the lower electrode 12 is made of polysilicon. The lower electrode 12 has a nitride layer 18 on a surface thereof in contact with the insulating film 14. The capacitor 10 is electrically connected to a source part 15 of a MOS transistor by polysilicon 19.

Figure 2:
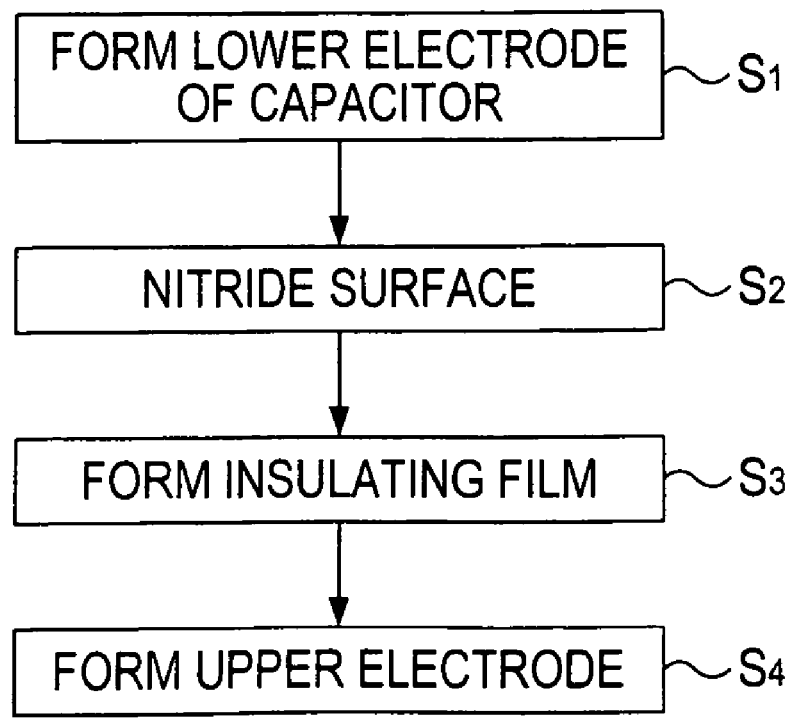
FIG. 2 is a flow showing an example of a manufacturing method of a semiconductor device of the present invention.

Next, processes for forming the capacitor 10 will be described based on FIG. 2. First, a contact hole is opened in the interlayer insulating film 17 by etching, and polysilicon is deposited by a CVD method or the like to form the lower electrode 12 (Step S1). Thereafter, the nitride layer 18 (polysilicon nitride film) is formed on the surface of the lower electrode 12 by plasma nitridation processing (Step S2). Thereafter, the insulating film 14 is formed on the nitride film 18 (Step S3). Further, the upper electrode layer 16 is formed (Step S4). Thereafter, for example, etching necessary to make a rugged shape is applied in order to increase a surface area, whereby the capacitor 10 is formed.

Figure 3:
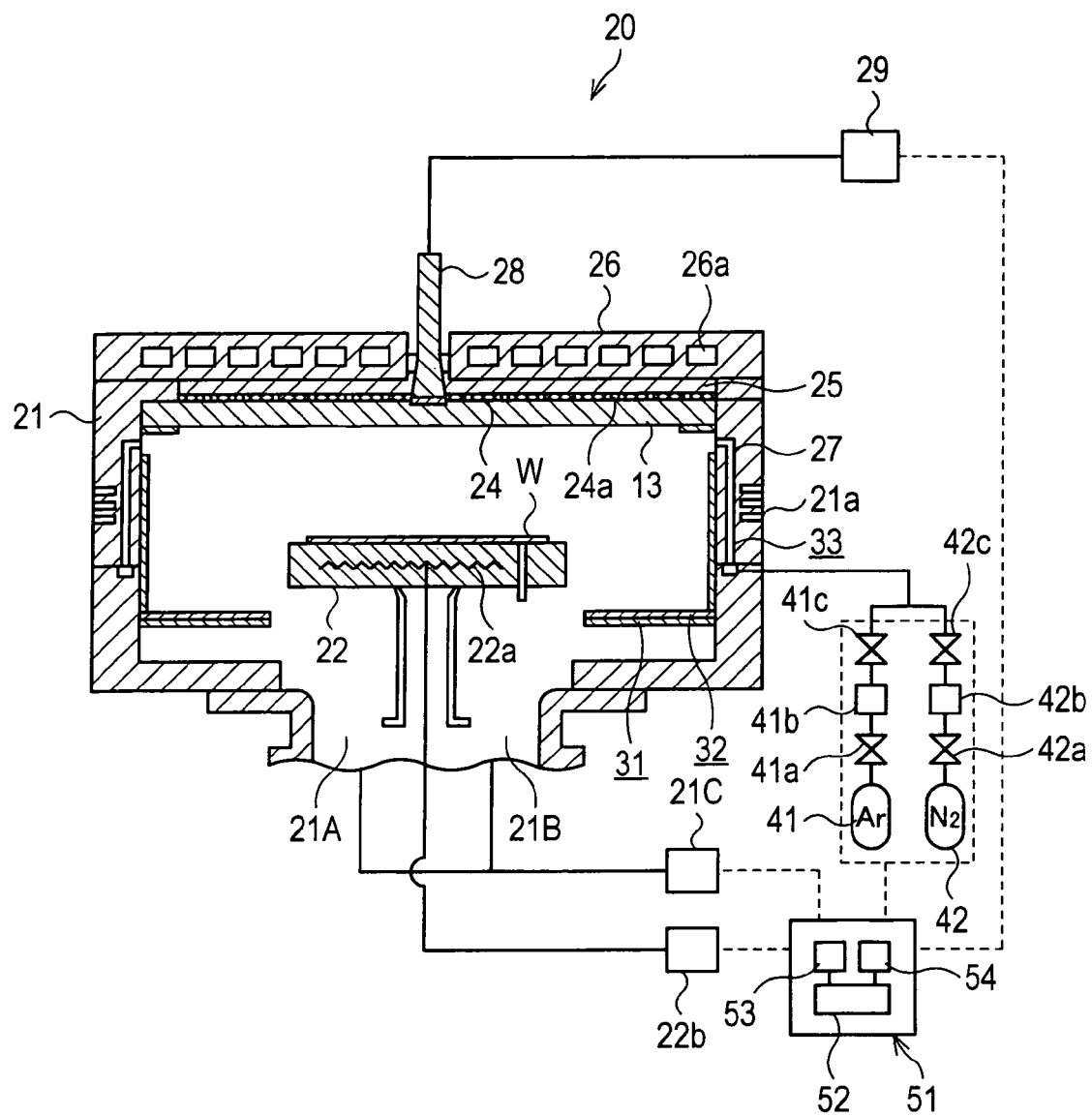
FIG. 3 is a cross-sectional view showing a structure of a plasma processing apparatus according to the present invention.

FIG. 3 shows an overview of a structure of a semiconductor manufacturing apparatus (plasma processing apparatus) 20 used for the plasma nitridation processing of the present invention. The semiconductor manufacturing apparatus 20 has a process vessel 21 including a substrate support table 22 supporting a silicon wafer W as a substrate to be processed. The substrate support table 22 has therein a heater 22a, so that it can heat a silicon wafer W to a desired temperature when supplied with power from a power source 22b.

Gas in the process vessel 21 is exhausted from exhaust ports 21A and 21B via an exhaust pump 21C. A gas baffle plate (partition plate) 31 made of aluminum is disposed around the substrate support table 22. A quartz cover 32 is provided on an upper surface of the baffle plate 31. The atmosphere inside the process vessel 21 is uniformly exhausted by the baffle plate 31.

An upper side of the process vessel 21 in the apparatus has an opening part corresponding to the silicon wafer W on the substrate support table 22. This opening part is closed by a dielectric plate 23 made of quartz or $Al_2O_3$. A plane antenna 24 is disposed on an upper side of the dielectric plate 23 (on an outer side of the process vessel 21). The plane antenna 24 has a plurality of slots 24a for allowing an electromagnetic wave supplied from a waveguide to pass therethrough. A retardation plate 25 and the waveguide 28 are disposed on a further upper side (outer side) of the plane antenna 24. A cooling plate 26 is disposed on an outer side of the process vessel 21 so as to cover an upper side of the retardation plate 25. A refrigerant path 26a through which a refrigerant flows is provided inside the cooling plate 26.

In an inner sidewall of the process vessel 21, provided is a gas supply port 27 through which gas is introduced at the time of the plasma nitridation processing. In this embodiment, as process gas supply sources, an argon gas supply source 41 and a nitrogen gas supply source 42 are prepared, and these gas supply sources are connected to the gas supply port 27 via valves 41a, 42a, mass flow controllers 41b, 42b for flow rate adjustment, and valves 41c, 42c, respectively. Further, a refrigerant path 21a is formed inside the inner wall of the process vessel 21 so as to surround the whole vessel.

The semiconductor manufacturing apparatus 20 includes an electromagnetic wave generator (magnetron) 29 generating a several GHz electromagnetic wave for plasma excitation. The microwave generated by the electromagnetic wave generator 29 propagates through the waveguide 28 to be introduced to the process vessel 21.

The semiconductor manufacturing apparatus 20 is controlled by a controller 51. The controller 51 has a central processing unit 52, a support circuit 53, and a recording medium 54 containing relevant control software. The controller 51 controls, for example, the supply, stop, flow rate adjustment of the gas supplied through the gas supply port 27, temperature adjustment of the heater 22a, the exhaust by the exhaust pump 21C, the electromagnetic wave generator 29, and so on, and performs necessary control operations in processes in which plasma processing is executed in the semiconductor manufacturing apparatus 20.

As the central processing unit 52 of the controller 51, a processor of a general-purpose computer is usable. Examples usable as the recording medium 54 are various types of recording media such as a RAM, a ROM, a flexible disk, and a hard disk. Further, the support circuit 53 is connected to the central processing unit 52 in order to support the processor in various ways. A main part of the semiconductor manufacturing apparatus 20 is structured as described above.

For forming the nitride layer 18 on the surface of the lower electrode 12 by the plasma nitridation processing, a wafer W in which the lower electrode 12 is formed above the silicon substrate 11 is set on the substrate support table 22. Thereafter, air inside the process vessel 21 is exhausted through the exhaust ports 21A, 21B. The inside of the process vessel 21 is set to a predetermined process pressure. Inert gas, for example, argon gas and nitrogen gas are supplied through the gas supply port 27.

The microwave with a several GHz frequency generated by the electromagnetic wave generator 29 is supplied to the process vessel 21 through the waveguide 28. The microwave is introduced into the process vessel 21 via the plane antenna 24 and the dielectric plate 23. Then, a plasma is excited by the microwave, so that a nitrogen radical is generated. By the high-density plasma generated by the microwave excitation in the process vessel 21, the nitride layer 18 is produced on the surface of the lower electrode 12.

Thereafter, the insulating film 14 is formed on the lower electrode 12. This insulating film 14 is, for example, a silicon oxide film. Next, the upper electrode layer 16 is formed on the insulating film 14, whereby the capacitor 10 is constructed. Heat treatment is applied in the process of forming the insulating film 14 or in the process of forming the upper electrode 16, but since the nitride layer 18 is formed on the lower electrode 12, the oxidation of the upper surface of the lower electrode 12 is effectively inhibited.

Incidentally, for the upper electrode 16, polysilicon is also usable instead of a metal material such as titanium nitride or aluminum. A silicon oxynitride film, tantalum oxide, aluminum oxide, or the like instead of the silicon oxide film is usable as the insulating film 14.

Next, plasma nitridation processing was actually applied on a silicon substrate to verify oxidation resistance of the nitride layer at the time of the heat treatment. Table 1 shows the result.

TABLE 1

| NO. | Ar/N2 (sccm) | PLASMA OUTPUT (W) | PROCESS PRESSURE (Pa) | PROCESS TEMPERATURE (° C.) | PROCESS TIME (sec) |
|---|---|---|---|---|---|
| 1 | 1000/40 | 3500 | 67 | 400 | 30 |
| 2 | 1000/40 | 3500 | 67 | 400 | 120 |
| 3 | 1000/40 | 3500 | 67 | 400 | 300 |
| 4 | RAPID THERMAL NITRIDATION PROCESSING | | | | 180 |

No. 1 to No. 3 are silicon substrates having undergone the plasma nitridation processing based on the present invention. For the samples based on the present invention, mixed gas of argon gas and nitrogen gas was used as process gas. A flow rate ratio thereof was 1000/40 (sccm) for all the samples. For all the samples, plasma output at the time of the plasma processing was 3500 W, process pressure was 67 Pa, and process temperature was 400° C. No. 1 to No. 3 are different in plasma processing time, the time for No. 1 being 30 seconds, the time for No. 2 being 120 seconds, and the time for No. 3 being 300 seconds. No. 4 shows, as a comparative example, data of a silicon substrate having undergone rapid thermal nitridation processing. The processing time thereof was 180 seconds. Seven samples were prepared for each of No. 1 to No. 4. The samples of No. 1 to No. 4 were subjected to thermal oxidation processing at a temperature within a range from 600° C. to 900° C. after being subjected to the aforesaid nitridation processing.

Figure 4:
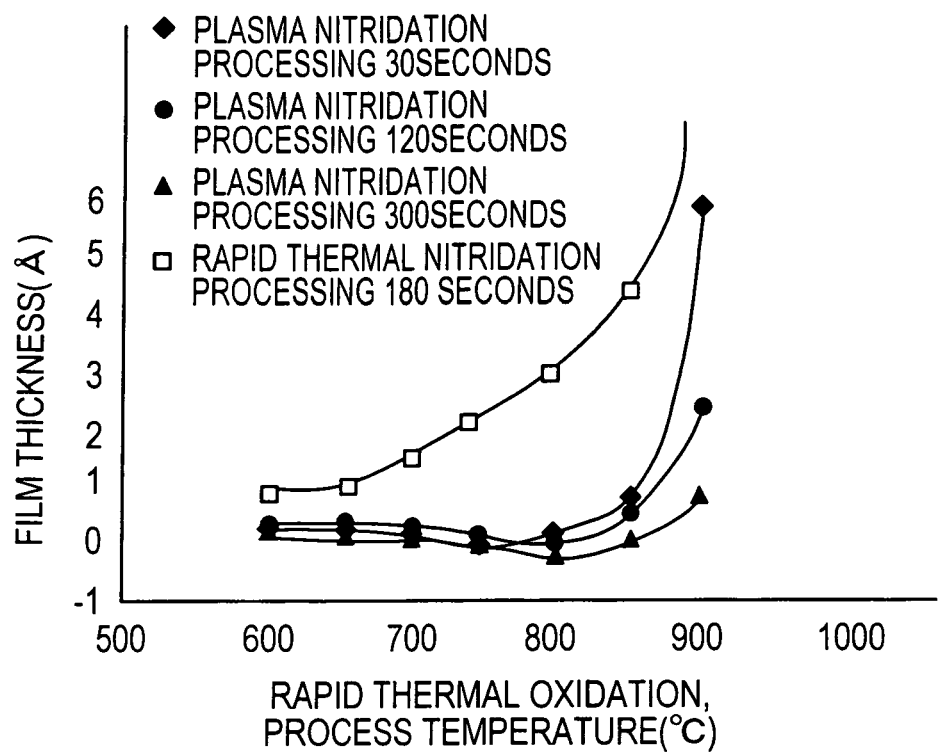
FIG. 4 is a graph showing an operation/effect of the capacitor according to the first embodiment.

FIG. 4 shows the effect given to a nitride film in the experiment shown in Table 1. The vertical axis represents an incremental amount of optical film thickness, in angstrom unit, by the oxidization of the nitride film. The horizontal axis represents process temperature, in centigrade unit, of the rapid thermal oxidation processing. Each point in the graph represents an incremental amount of the nitride film by the thermal oxidation at the temperature of the thermal oxidation processing. As is seen from this graph, the samples having undergone the plasma nitridation processing exhibit a relatively smaller incremental amount of the optical film thickness than the samples having undergone the rapid thermal nitridation processing, and are less effected by the thermal oxidation. It is also seen that the incremental amount of the optical film thickness is smaller as the time of the plasma nitridation processing is longer. Therefore, it can be said that the nitride film becomes thicker as the time of the plasma nitridation processing is longer and as the nitride film resulting from the plasma nitridation processing is thicker, the effect of the thermal oxidation is smaller and a higher oxidation resistance can be obtained.

Figure 5:
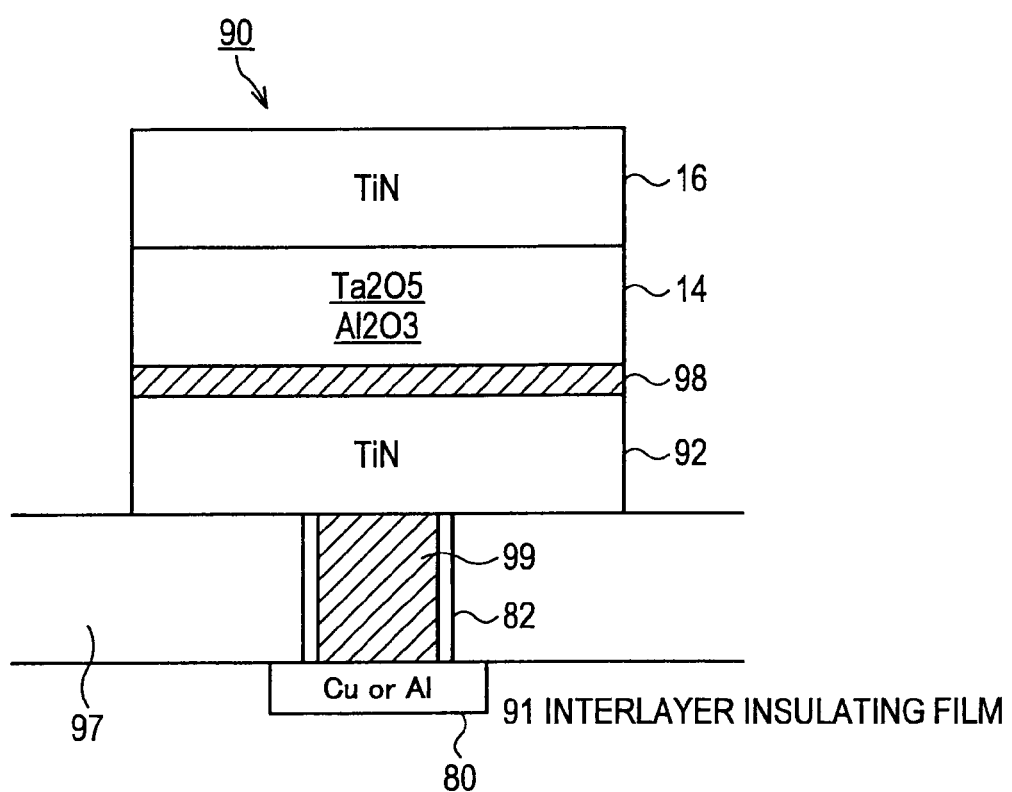
FIG. 5 is an explanatory view of a cross section showing a structure of a capacitor according to a second embodiment of the present invention.

Next, a second embodiment will be described. This embodiment uses titanium nitride instead of polysilicon as a lower electrode 92 of a capacitor. FIG. 5 shows its structure. Note that in the description of this embodiment, the same reference numerals are used to designate components the same as or corresponding to those of the above-described first embodiment, and repeated description will be omitted.

A capacitor 90 is structured such that a via hole is opened by etching on an interlayer insulating film 97 formed on an interlayer insulating film 91, a barrier metal 82 and a via metal 99 are buried therein, and a lower electrode 92 made of titanium nitride, an insulating film 14 formed on the lower electrode 92, and an upper electrode 16 formed on the insulating film 14 are formed by CVD. The upper electrode 16 is a metal layer of TiN or the like. In the lower electrode 92, a nitrogen-rich layer 98 is formed on a surface thereof in contact with the insulating film 14. The capacitor 90 is connected to an Al wiring or a Cu wiring 80, and is finally electrically connected to a source electrode of a MOS transistor.

Figure 6A:
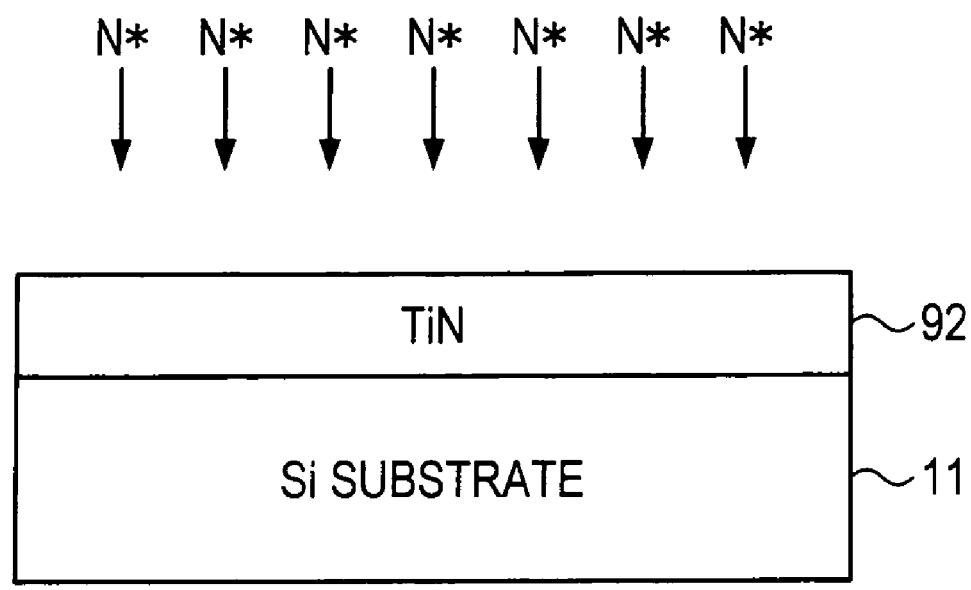
FIG. 6A and FIG. 6B are process views showing part of manufacturing processes of the capacitor according to the second embodiment, FIG. 6A showing a state where titanium nitride is deposited and FIG. 6B showing a state where a nitrogen-rich layer is formed by plasma nitridation processing.
Figure 6B:
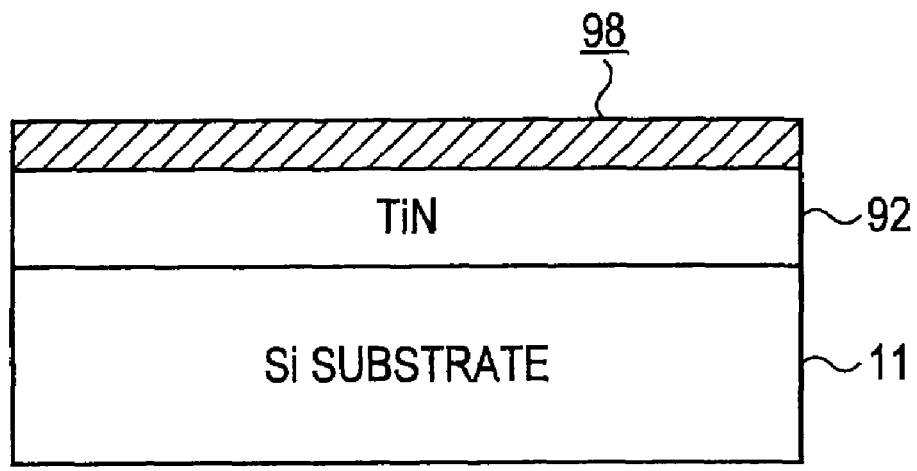

For forming the capacitor 90, the via hole is opened by etching the interlayer insulating film 97 which is formed on the interlayer insulating film 91 by a CVD method or the like, the barrier metal 82 and the via metal 99 are buried therein, and titanium nitride is deposited thereon, whereby the lower electrode 92 is formed. Thereafter, the nitrogen-rich layer 98 is formed on the surface of the lower electrode 92 by plasma nitridation processing (see FIG. 6A and FIG. 6B).

Part of the manufacturing processes of the capacitor 90 according to this embodiment is performed by the plasma processing apparatus 20 shown in FIG. 3. For making the surface of the lower electrode 92 rich in nitrogen, a wafer W in which the lower electrode 92 is formed on a silicon substrate 11 is set on the substrate support table 22 of the plasma processing apparatus 20. Thereafter, air in the process vessel 21 is exhausted through the exhaust ports 21A, 21B. The inside of the process vessel 21 is set to a predetermined process pressure. Inert gas and nitrogen gas are supplied through the gas supply port 27.

Meanwhile, a microwave with a several GHz frequency generated by the electromagnetic wave generator is supplied to the process vessel 21 through the waveguide 28. The microwave is introduced into the process vessel 21 via the plane antenna 24 and the dielectric plate 23. Then, this microwave excites a plasma to generate a nitrogen radical. By the high-density plasma generated by the microwave excitation in the process vessel 21, the further nitrided layer 98 is produced here on the surface of the lower electrode 92. Nitrogen is distributed on the whole lower electrode 92 since it is made of titanium nitride. The nitrogen is doped by the plasma nitridation processing, whereby the nitrogen-rich layer 98 is formed. Therefore, the nitrogen-rich layer 98 is a layer containing a larger amount of nitrogen than other areas in the lower electrode 92.

Thereafter, the insulating film 14 is formed on the lower electrode 92. This insulating film 14 is, for example, a silicon oxide film. Next, the upper electrode 16 is formed on the insulating film 14, whereby the capacitor 90 is constructed. Heat treatment is carried out in the process of forming the insulating film 14 or the process of forming the upper electrode 16, but since the nitrogen-rich layer 98 is formed on the lower electrode 92, the oxidation of an upper surface of the lower electrode 92 is effectively inhibited.

Incidentally, for the upper electrode 16, polysilicon is also usable instead of a metal material such as titanium nitride or aluminum. Further, as the insulating film 14, usable is a silicon oxynitride film, tantalum oxide, aluminum oxide, or the like, instead of the silicon oxide film.

Figure 7:
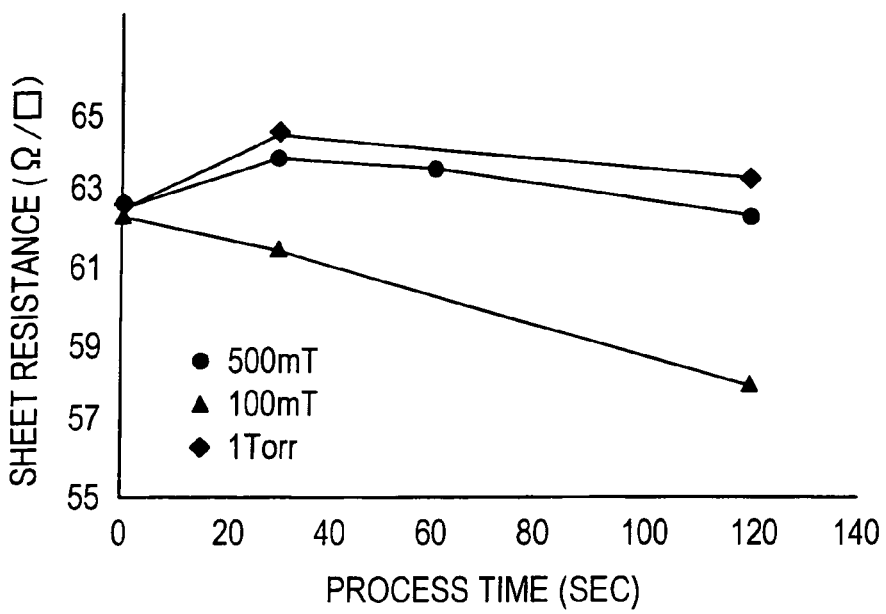
FIG. 7 is a graph showing an operation/effect of the capacitor according to the second embodiment.

FIG. 7 shows the correlation between the process time of the plasma nitridation processing of the lower electrode 92 and its sheet resistance. As shown in the graph in FIG. 7, measurements were separately conducted under the gas pressure of 1 Torr (133 Pa), 100 mT (13.3 Pa), and 500 mT (66.5 Pa). As a result, the sheet resistance becomes lower as the gas pressure of nitrogen is lower. That is, it is seen that the nitrogen-rich layer 98 can be formed more efficiently as the gas pressure is lower.

Next, oxidation resistance of the titanium nitride film at the time of the heat treatment was studied. Samples were prepared in each of which a nitrogen-rich layer was formed by applying plasma nitridation processing to a titanium nitride film after the titanium nitride film was formed on a silicon substrate. As the samples according to the present invention, two kinds were prepared, namely, a sample to which the plasma nitridation processing was applied for 120 seconds (□ in FIG. 8) and a sample to which the plasma nitridation processing was applied for 30 seconds (Δ in FIG. 8). Also prepared for comparison was a substrate having only a titanium nitride film to which no plasma nitridation processing was applied (in ○ FIG. 8).

Figure 8:
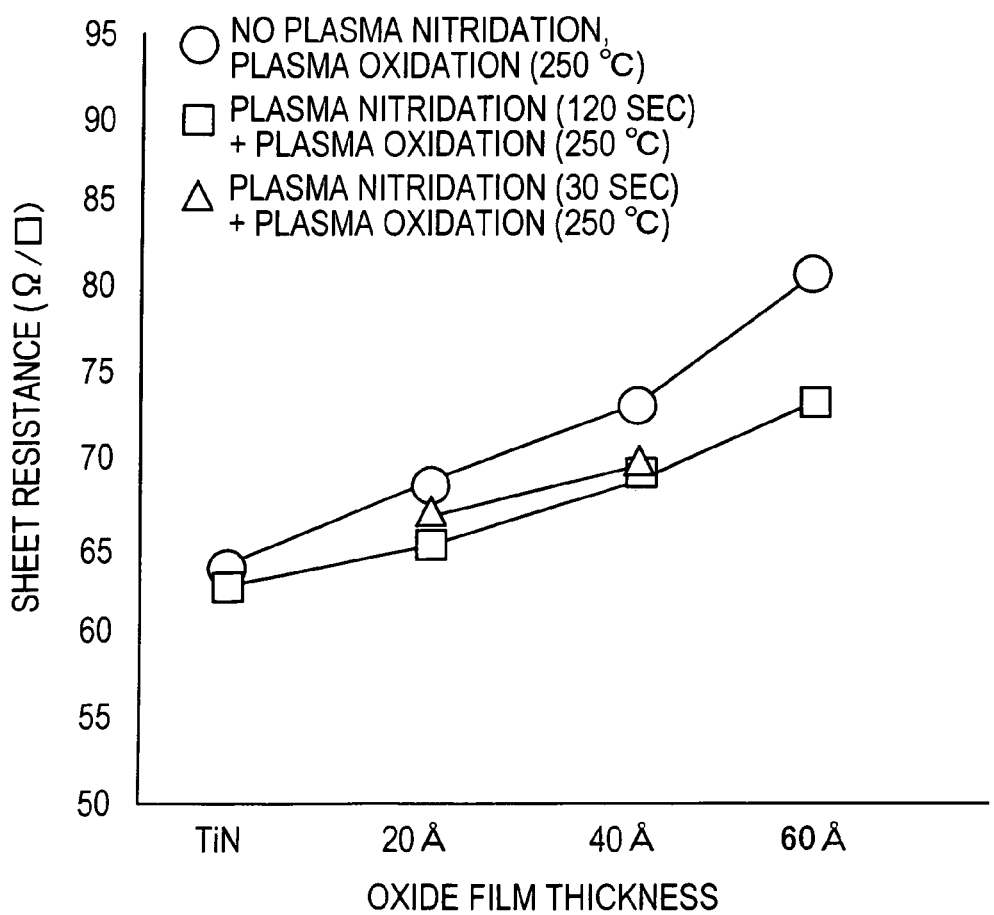
FIG. 8 is a graph showing an operation/effect of the capacitor according to the second embodiment.

In this experiment, the sheet resistance was measured while the plasma oxidation processing was applied, and the effect of the plasma nitridation processing was studied. FIG. 8 shows the measurement result. In the graph in FIG. 8, the vertical axis represents a sheet resistance value of the titanium nitride film (lower electrode 92). The horizontal axis represents a reference value (TiN as depo) before the plasma oxidation processing was applied, and 20 angstroms, 40 angstroms, and 60 angstroms as an oxide film thickness when the plasma oxidation processing was applied to a silicon substrate cleaned with hydrofluoric acid. The larger oxide film thickness indicates the longer time of the plasma oxidation processing. It is seen from this graph that as the plasma oxidation proceeds, the sample not having undergone the plasma nitridation processing exhibits an increase in sheet resistance value and thus is significantly effected by the oxidation by the heat treatment. On the other hand, the samples having undergone the plasma nitridation processing exhibit a small increase in sheet resistance value and thus are less susceptible to the effect of the oxidation by the heat treatment. That is, the result shows that the samples having undergone the plasma nitridation processing are superior in oxidation resistance at the time of the heat treatment.

Next, the effect of pressure in the plasma nitridation processing was studied. In order to increase a surface area, a capacitor sometimes has a three-dimensional structure having deep holes or having a rugged shape. In such a case, difference in film thickness is liable to occur depending on each portion. It is important to make the film thickness uniform since difference in film thickness leads to difference in electric property, and according to the findings by the present inventors, it has been confirmed that pressure at the time of the plasma nitridation effects uniformity in film thickness especially in a capacitor having such a three dimensional structure.

Figure 9:
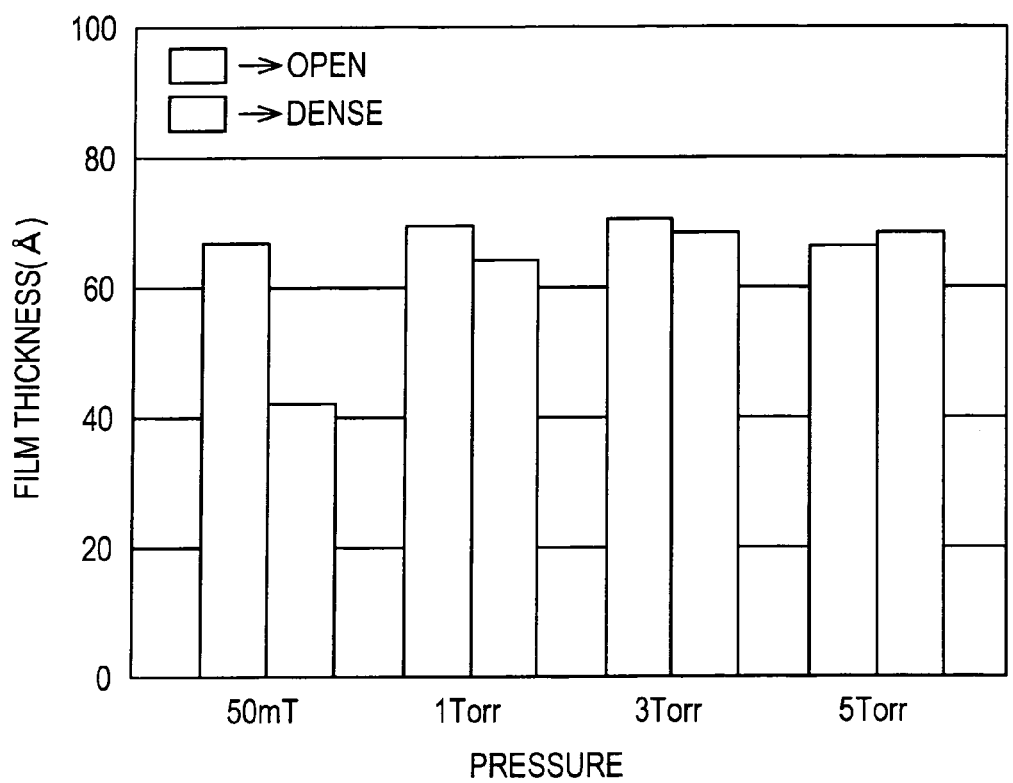
FIG. 9 is a graph showing pressure dependency of film thickness in plasma nitridation processing.

FIG. 9 shows film thickness when in a capacitor whose Si lower electrode has a rugged surface, plasma nitridation processing was applied to the lower electrode with pressure at the time of the plasma processing being varied. Open in the drawing means a case where the ruggedness of the surface of the lower electrode is sparse, and Dense means a case where the ruggedness of the surface of the lower electrode is dense, each of them showing film thickness at a bottom of a recessed portion.

From the result, it can be confirmed that uniformity in film thickness depends on pressure at the time of the plasma nitridation processing, and according to the findings of the present inventors, the pressure is preferably within a range from 1 Torr (133 Pa) to 5 Torr (665 Pa), more preferably about 3 Torr (399 Pa).

Figure 10:
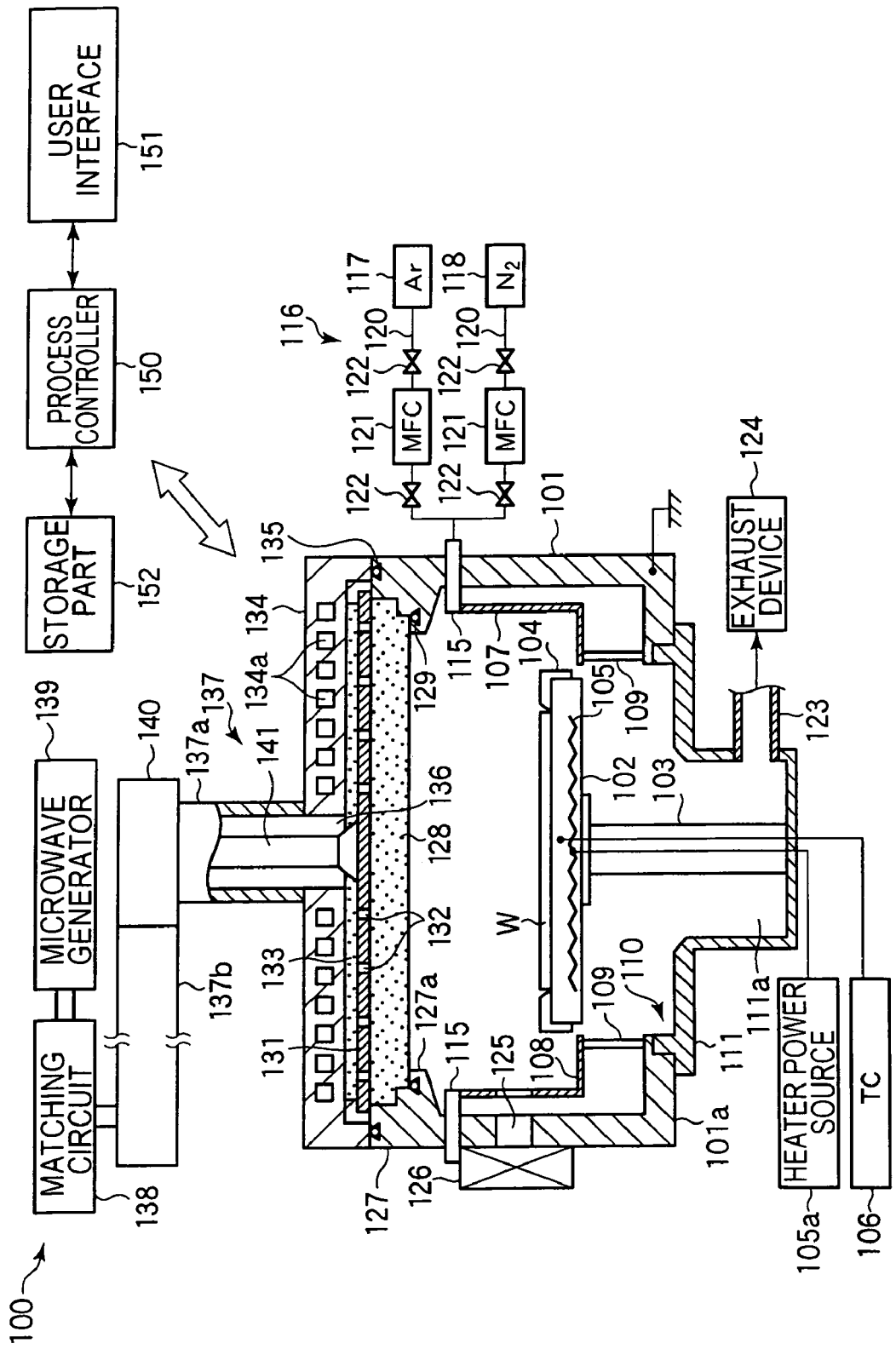
FIG. 10 is a cross-sectional view showing a structure of another plasma processing apparatus suitable for implementing a method of the present invention.

Next, another embodiment will be described. FIG. 10 is a cross-sectional view schematically showing an example of a plasma processing apparatus suitable for implementing a plasma nitridation method of the present invention. This plasma processing apparatus is structured as a RLSA-type microwave plasma processing apparatus that generates a plasma by introducing a microwave into a process chamber through a plane antenna having a plurality of slots, specifically, a RLSA (Radial Line Slot Antenna), and thereby is capable of generating a high-density microwave plasma with low electron temperature and it is suitably used for the purpose of applying nitridation processing to a polysilicon film being a lower electrode in manufacturing processes of, for example, a MIS capacitor.

This plasma processing apparatus 100 has a chamber 101 in a substantially cylindrical shape that is airtightly structured and grounded. A circular opening part 110 is formed in a substantially center portion of a bottom wall 101a of the chamber 101, and an exhaust chamber 111 communicating with the opening part 110 and protruding downward is provided in the bottom wall 101a.

A susceptor 102 made of ceramics such as AlN for horizontally supporting a wafer W being a substrate to be processed is provided in the chamber 101. The susceptor 102 is supported by a cylindrical support member 103 made of ceramics such as AlN and extending upward from a center of a bottom of the exhaust chamber 111. A guide ring 104 for guiding the wafer W is provided along an outer periphery of the susceptor 102. Further, a heater 105 of a resistance heating type is buried in the susceptor 102, and this heater 105 heats the susceptor 102 when supplied with power from a heater power source 105a to heat the wafer W being a processing target by its heat. Further, a thermocouple 106 is disposed in the susceptor 102, so that heating temperature of the wafer W is controllable, for example, within a range from room temperature to 900° C. A cylindrical liner 107 made of quartz is provided along an inner periphery of the chamber 101 to prevent metal contamination caused by a constituent material of the chamber 101. Further, on an outer periphery side of the susceptor 102, a ring-shaped baffle plate 108 is provided for uniform exhaust of the chamber 101, and this baffle plate 108 is supported by a plurality of support posts 109.

On the susceptor 102, wafer support pins (not shown) for supporting and lifting up/down the wafer W are provided to be projectable/retractable relative to a surface of the susceptor 102.

A ring-shaped gas introducing member 115 is provided in a sidewall of the chamber 101, and a gas supply system 116 is connected to this gas introducing member 115. The gas introducing member 115 may be disposed in a shower-like manner. The gas supply system 116 has, for example, an Ar gas supply source 117 and a $N_2$ gas supply source 118, and these gases reach the gas introducing member 115 via gas lines 120 respectively to be introduced into the chamber 101 through the gas introducing member 115. Each of the gas lines 120 has a mass flow controller 121 and opening/closing valves 122 provided in front of and behind the mass flow controller 121. Incidentally, instead of the aforesaid $N_2$ gas, for example, $NH_3$ gas, mixed gas of $N_2$ and $H_2$, or the like is also usable. Further, as will be described later, other rare gas, for example, gas of Kr, He, Ne, Xe, or the like may be used instead of the Ar gas, or the rare gas need not be included.

An exhaust pipe 123 is connected to a side face of the exhaust chamber 111, and an exhaust device 124 including a high-speed vacuum pump is connected to the exhaust pipe 123. When this exhaust device 124 is put into operation, gas in the chamber 101 is uniformly let out into a space 111a of the exhaust chamber 111 to be exhausted via the exhaust pipe 123. This enables high-speed reduction of pressure in the chamber 101 up to a predetermined vacuum degree, for example, 0.133 Pa.

A carry-in/out port 125 through which the wafer W is carried into/out of a transfer chamber (not shown) adjacent to the plasma processing apparatus 100 and a gate valve 126 opening/closing the carry-in/out port are provided in the sidewall of the chamber 101.

An upper side of the chamber 101 is formed as an opening part and a ring-shaped support part 127 is provided along a periphery of the opening part. On this support part 127, a microwave transmitting plate 128 made of dielectric, for example, quartz, ceramics such as $Al_2O_3$, or AlN and transmitting the microwave is airtightly provided via a sealing member 129. Therefore, the inside of the chamber 101 is kept airtight.

Figure 11:
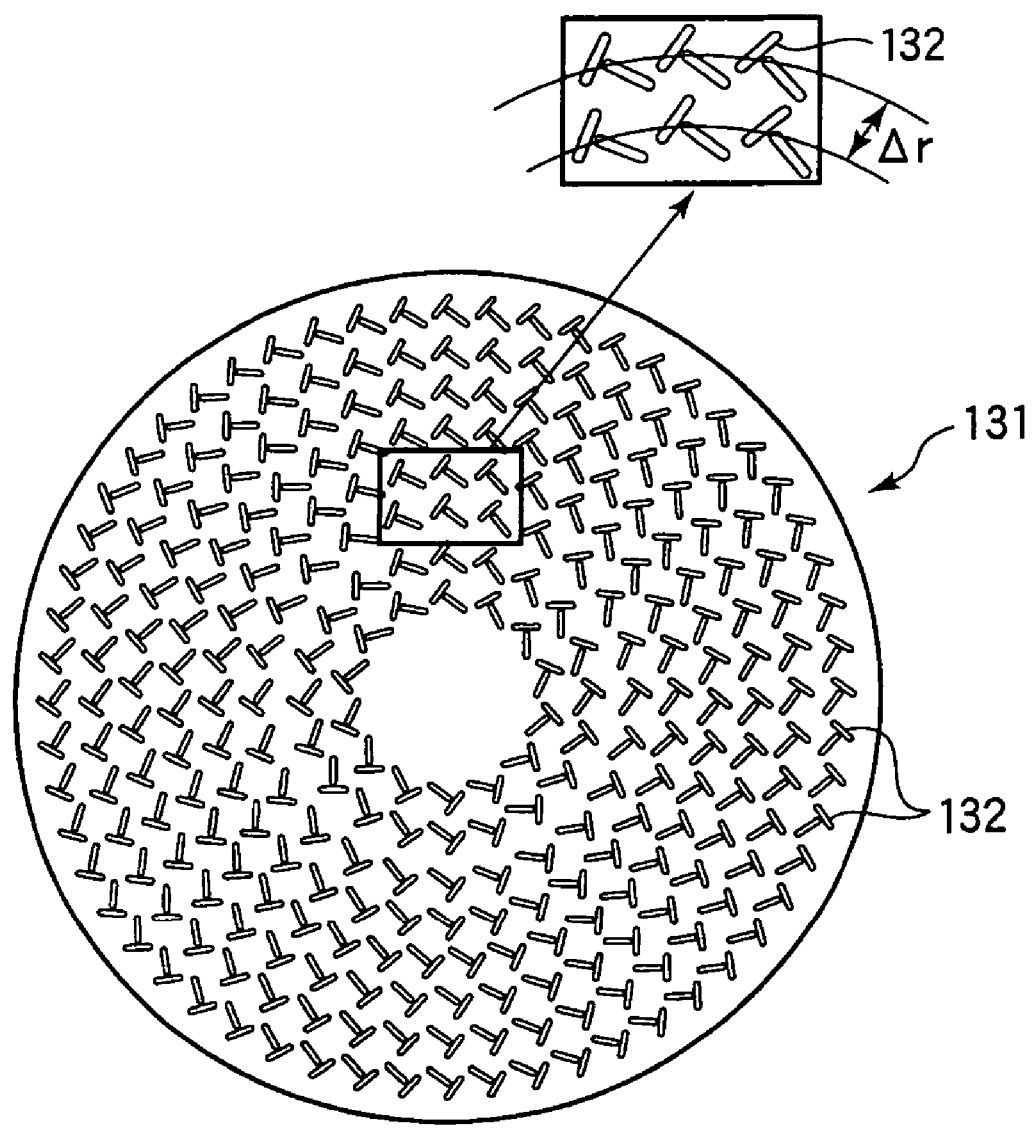
FIG. 11 is a view showing a structure of a plane antenna member.

On an upper side of the microwave transmitting plate 128, a plane antenna member 131 in a disk shape is provided to face the susceptor 102. The plane antenna member 131 is locked by upper ends of the sidewalls of the chamber 101. The plane antenna member 131 is made of, for example, a copper plate or an aluminum plate whose surface is silver- or gold-plated, and has a large number of microwave radiation holes 132 (slots) which are penetratingly formed in a predetermined pattern. For example, as shown in FIG. 11, each of the microwave radiation holes 132 is in a long groove shape, the microwave radiation holes 132 adjacent to each other are arranged in, typically, a "T" shape, and these plural microwave radiation holes 132 are arranged concentrically. The length and arrangement interval of the microwave radiation holes 132 are determined according to a wavelength (λg) of the microwave, and for example, the microwave radiation holes 132 are arranged at an interval of ½ λg, ¼ λg or λg. Note that in FIG. 11, the interval of the concentrically arranged microwave radiation holes 132 adjacent to each other is shown by Δr. Alternatively, the microwave radiation holes 132 may have other shape such as a circular shape or an arc shape. Further, the arrangement form of the microwave radiation holes 132 is not limited to specific one, and they can be arranged in, for example, spirally or radially, other than concentrically.

On an upper surface of the plane antenna member 131, a retardation member 133 higher in dielectric constant than vacuum is provided. The retardation member 133 can be formed of a material such as, for example, quartz, ceramics, or fluorine resin. Since the microwave has a long wavelength in vacuum, the retardation member 133 has a function of shortening the wavelength of the microwave for the purpose of plasma adjustment. Incidentally, the plane antenna member 131 and the microwave transmitting plate 128, and the retardation member 133 and the plane antenna member 131 may be disposed to be in close contact with each other or to be apart from each other.

On an upper surface of the chamber 101, a shielding cover 134 made of a metal material such as, for example, aluminum, stainless steel, or copper is provided so as to cover the plane antenna member 131 and the retardation member 133. The upper surface of the chamber 101 and the shielding cover 134 are sealed by a sealing member 135. A cooling water flow path 134a is formed in the shielding cover 134, and cooling water, when flowing therein, cools the shielding cover 134, the retardation member 133, the plane antenna member 131, and the microwave transmitting plate 128. Note that the shielding cover 134 is grounded.

The shielding cover 134 has an opening part 136 at a center of its upper wall, and a waveguide 137 is connected to the opening part 136. A microwave generator 139 is connected to an end portion of the waveguide 137 via a matching circuit 138. With this structure, the microwave with, for example, a 2.45 GHz frequency generated by the microwave generator 139 propagates to the aforesaid plane antenna member 131 via the waveguide 137. Other usable frequencies of the microwave are 8.35 GHz, 1.98 GHz, and so on.

The waveguide 137 has: a coaxial waveguide 137a having a circular cross section and extending upward from the opening 136 of the aforesaid shielding cover 134; and a rectangular waveguide 137b connected to an upper end portion of the coaxial waveguide 137 a via a mode converter 140 and extending horizontally. The mode converter 140 between the rectangular waveguide 137b and the coaxial waveguide 137a has a function of converting the microwave propagating in a TE mode in the rectangular waveguide 137b to a TEM mode. An inner conductor 141 extends in the center of the coaxial waveguide 137a, and a lower end portion of the inner conductor 141 is fixedly connected to the center of the plane antenna member 131. With this structure, the microwave uniformly and efficiently propagates to the plane antenna member 131 via the inner conductor 141 of the coaxial waveguide 137a.

The components of the plasma processing apparatus 100 are connected to a process controller 150 including a CPU to be controlled thereby. To the process controller 150, connected are a user interface 151 including a keyboard for use by, for example, a process manager in inputting a command for managing the plasma processing apparatus 100, a display displaying a visualized operation status of the plasma processing apparatus 100, and so on.

Further, to the process controller 150, also connected is a storage part 152 storing: control programs (software) for realizing various kinds of processing executed in the plasma processing apparatus 100 under the control of the process controller 150; and recipes in which process condition data and so on are recorded.

An arbitrary recipe is called as required from the storage part 152 in response to an instruction from the user interface 151 or the like and the process controller 150 executes the recipe, so that desired processing in the plasma processing apparatus 100 is executed under the control of the process controller 150. Further, as the aforesaid control program and recipes of the process condition data and so on, usable are those stored in a computer readable storage medium, for, example, a CD-ROM, a hard disk, a flexible disk, a flash memory, or the like, or those transmitted as required from other apparatus via, for example, a leased line for on-line use.

The plasma processing apparatus 100 as structured above can perform plasma processing free from damage to a base film and the like at low temperature of 800° C. or lower, and can realize superior plasma uniformity, leading to process uniformity. As a result of plasma nitridation processing by the plasma processing apparatus 100 under a controlled pressure of a predetermined value, it is possible to uniformly form a nitride film even when a recessed portion has a high aspect ratio as will be described later.

In the RLSA-type plasma processing apparatus 100 as structured above, it is possible to carry out processing such as directly nitriding a polysilicon film exposed on a surface of a wafer W to form a silicon nitride film, in the following procedure.

First, the gate valve 126 is opened and the wafer W on which the polysilicon film is formed is carried into the chamber 101 from the carry-in/out port 125 to be placed on the susceptor 102. Then, Ar gas and $N_2$ gas are introduced from the Ar gas supply source 117 and the $N_2$ gas supply source 118 of the gas supply system 116 via the gas introducing member 115 at predetermined flow rates.

Specifically, for example, the flow rate of the rare gas such as Ar is set to 1 mL to 5000 mL/min (sccm) and the flow rate of the $N_2$ gas is set to 10 mL to 500 mL/min (sccm), process pressure in the chamber is adjusted to 66.7 Pa to 1333 Pa (500 mTorr to 10 Torr), and the wafer W is heated to a temperature substantially within a range from 250° C. to 800° C., preferably from 400° C. to 800° C.

Next, the microwave from the microwave generator 139 is guided to the waveguide 137 via the matching circuit 138, is made to pass through the rectangular waveguide 137b, the mode converter 140, and the coaxial waveguide 137b sequentially, is supplied to the plane antenna member 131 via the inner conductor 141, and is emitted from the microwave radiation holes 132 of the plane antenna member 131 to a space above the wafer W in the chamber 101 via the microwave transmitting plate 128. The microwave propagates in the TE mode in the rectangular waveguide 137b, and this microwave in the TE mode is converted to the TEM mode in the mode converter 140 to propagate in the coaxial waveguide 137a toward the plane antenna member 131. The microwave emitted from the plane antenna member 131 to the chamber 101 via the microwave transmitting plate 128 forms an electromagnetic field in the chamber 101, so that the plasma of the Ar gas and the $N_2$ gas is generated. At this time, power of the microwave generator 139 is preferably 1 kW to 5 kW, more preferably 2 kW to 4 kW.

When the microwave is emitted from a large number of the microwave radiation holes 132 of the plane antenna member 131, the microwave plasma comes to have a high density of about $1\times10^{10}$ electrons to about $5\times10^{12}$ electrons/cm$^3$ and a low electron temperature of about 1.5 eV or lower, preferably about 1.0 eV or lower near the wafer W. Incidentally, a shower plate having a large number of openings may be disposed in the plasma passage space in the chamber 101 for use in the processing. This can further lower the electron temperature of the plasma to 0.7 eV or lower. Ions or the like in the microwave plasma thus generated give only a little damage to a base film. The $Si_3N_4$ film may be formed by directly introducing N into silicon by the action of the active species in the plasma, mainly, a nitrogen radical (N*) or the like.

In this manner, good nitridation processing can be applied to the exposed polysilicon film so that the nitride film has little variation in thickness. Especially in a case where the polysilicon film has a recessed portion with a high aspect ratio as in a trench structure of a MIS capacitor, the process pressure is preferably set to 133.3 Pa to 666.5 Pa (1 Torr to 5 Torr), desirably 400 Pa to 533 Pa (3 Torr to 4 Torr), which realizes uniform nitridation processing up to the bottom of the recessed portion, as will be described later.

Figure 12:
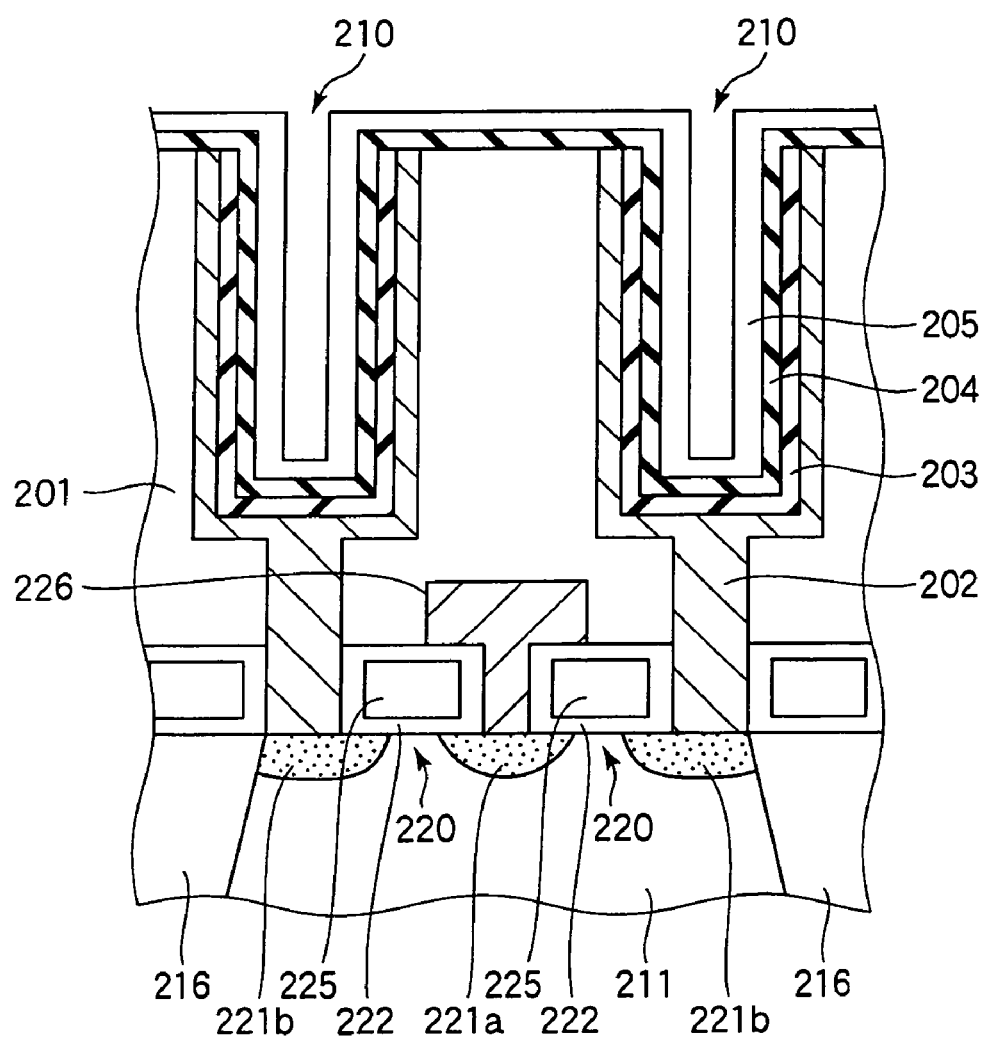
FIG. 12 is a schematic view of a cross section of a wafer to illustrate a rough structure of a semiconductor device.

Next, a semiconductor device manufactured by the method of the present invention will be described, taking a MIS capacitor with the trench structure as an example. FIG. 12 schematically shows a structure of a cross section of memory cells of a semiconductor device such as a DRAM. Note that FIG. 12 shows two memory cells each constituted of one transistor 220 and one capacitor 210.

P-well regions and n-well regions (neither is shown) are formed on a Si substrate 211, and sources 221b and drains 221a are formed in regions (active regions) insulatingly isolated by element isolating films 216. On the Si substrate 211, gate electrodes 225 made of polysilicon, or high melting point metal such as tungsten or its silicide are formed via a gate insulating film 222 to constitute the transistors 220. In this example, the transistors 220 are formed in pair. The gate electrodes 225, 225 of these transistors 220,220 also work as word lines.

Further, the transistors 220, 220 are covered with an interlayer insulating film 201, and a bit line 226 common to the transistors 220, 220 is disposed in the interlayer insulating film 201. This bit line 226 is connected to the drain 221a.

Each of the capacitors 210, which are formed in the interlayer insulating film 201, is composed of a polysilicon film 202 as a lower electrode, a silicon nitride film 203 which is a nitrided surface of a recessed portion of the polysilicon film 202, a $Ta_2O_5$ film 204 as a dielectric layer formed on the silicon nitride film 203, and a TiN film 205 being an upper electrode formed on the $Ta_2O_5$ film 204 to cover it. Note that the polysilicon films 202 of the capacitors 210 extends downward to be connected to the sources 221b, 221b via contact holes.

Manufacturing processes of thus structured capacitor constituting part of the memory cell will be described with reference to FIG. 13A, FIG. 13B, and FIG. 13C.

Figure 13A:
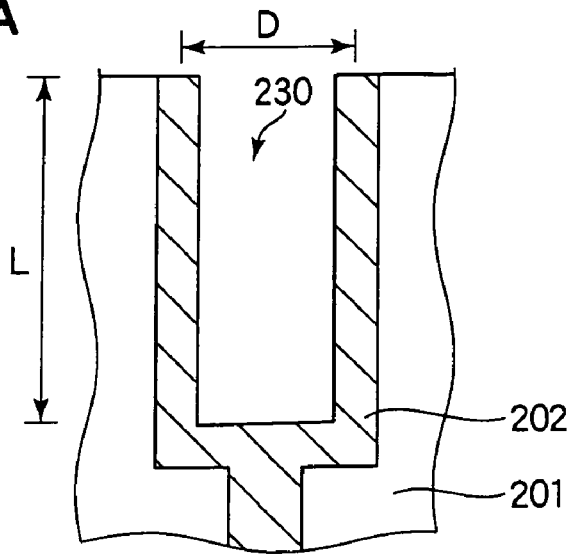
FIG. 13A, FIG. 13B, and FIG. 13C are schematic views of a cross section of the wafer to illustrate manufacturing processes of a capacitor.

First, the polysilicon film 202 having a recessed portion 230 as shown in FIG. 13A is formed on a surface of the interlayer insulating film 201. The polysilicon film 202 can be formed by, for example, CVD (Chemical Vapor Deposition). A ratio of depth L and width D (L/D; aspect ratio) of the recessed portion 230 formed in the polysilicon film 202 is, for example, about 10 to about 40.

Figure 13B:
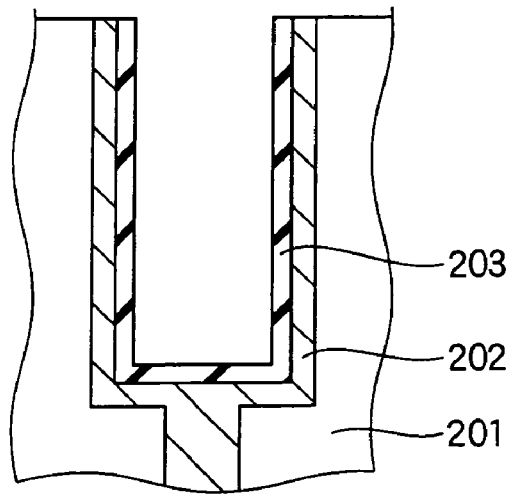

This polysilicon film 202 is plasma-processed by using the plasma processing apparatus 100, whereby the silicon nitride film 203 is formed as shown in FIG. 13B. The plasma nitridation processing is carried out by the plasma processing apparatus 100 while the Ar gas and the $N_2$ gas are controlled to a predetermined flow ratio. In the present invention, by the nitridation processing at the aforesaid process pressure by using the plasma processing apparatus 100 shown in FIG. 10, it is possible to uniformly nitride the recessed portion 230 even when the aspect ratio of the recessed portion 230 is 1 or more, for example, preferably 1 to 100, or more preferably, when the aspect ratio is high such as 10 or more.

High pressure is preferable as a condition of the plasma nitridation processing in view of uniformity of the silicon nitride film 203 on the surface of the wafer W, in particular, in view of eliminating difference in the nitridation degree of the polysilicon film 202 depending on portions of the trench structure (for example, top, middle, and bottom of a trench) with a high aspect ratio It can be thought that under a condition of relatively high pressure of, for example, 400 Pa or higher, the active species mainly containing nitrogen radicals are generated and a nitridation reaction becomes reaction-rate dependent, so that the nitridation reaction proceeds uniformly along the shape of the recessed portion of the polysilicon film 202, ensuring thickness uniformity of the nitride film, whereas under the condition of low pressure of, for example, about 6.7 Pa, the active species mainly containing ions are generated to increase ion potential energy in the plasma and a nitridation reaction becomes supply-rate dependent. Especially when the silicon nitride film 203 with about 0.5 nm to about 3 nm thickness is formed, controlling the pressure to a high side by using the plasma processing apparatus brings about a significant effect, enabling uniform film deposition.

Therefore, it is possible to set the process pressure in the chamber to, for example, 66.7 Pa to 1333 Pa (500 mTorr to 10 Torr), preferably 133.3 Pa to 666.5 Pa (1 Torr to 5 Torr), desirably 400 Pa to 533 Pa (3 Torr to 4 Torr). As the process gas, it is preferable to use gas containing 5% or more, preferably 10% or more of $N_2$ gas, and the process gas preferably contains rare gas selected from Ar, He, Xe, Kr, and the like. The flow rate of the process gas is preferably as follows, for instance. The rare gas such as Ar: 0 mL to 5000 mL/min and $N_2$ gas: 10 mL to 500 L/min. Concretely, for example, the flow rate of the rare gas can be 1000 mL/min and the flow rate of the $N_2$ gas can be 100 mL/min.

The process temperature can be 250° C. to 800° C., and is more preferably 400° C. to 800° C.

As a result of the plasma nitridation processing under such conditions, the silicon nitride film ($Si_3N_4$) 203 is formed uniformly on the surface of the polysilicon film 202. The $Ta_2O_5$ film 204 is formed on the silicon nitride film 203 in a post process. Heat treatment is included in forming this $Ta_2O_5$ film 204, and without the silicon nitride film 203, the surface of the polysilicon film 202 oxidizes in the course of the heat treatment, so that $SiO_2$ is produced, which increases the film thickness of the whole capacitor. The formation of the $SiO_2$ film on the polysilicon film 202 has a merit in reducing leakage current on one hand, but on the other, reduces the capacity of the capacitor. Therefore, nitriding the surface of the polysilicon film 202 prior to the formation of the $Ta_2O_5$ film 204 is advantageous since it can reduce leakage current while preventing the decrease of the whole capacity.

Figure 13C:
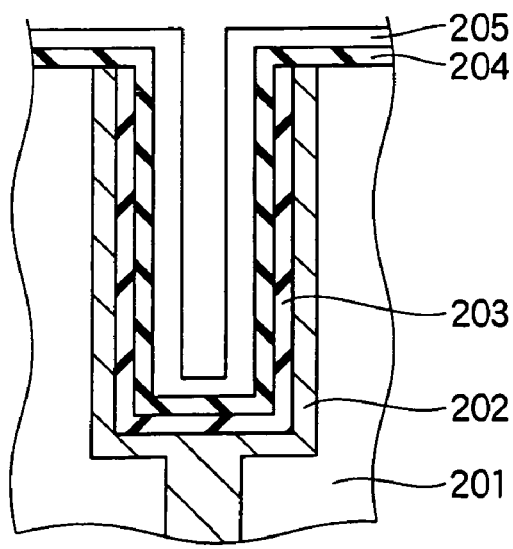

After the silicon nitride film 203 is formed by applying the nitridation processing to the surface of the polysilicon film 202, $Ta_2O_5$ is deposited by CVD using, for example, etoxytantalum Ta $(OC_2H_5)_5$ as a raw material, and the $Ta_2O_5$ is annealed (600° C. to 1000° C.) by RTP (Rapid Thermal Processing) in an oxidation atmosphere to be crystallized, whereby the $Ta_2O_5$ film 204 being a high dielectric layer is formed, as shown in FIG. 13C. Further, the titanium nitride film (TiN film) 205 as an upper electrode is deposited on the $Ta_2O_5$ film 204, so that the capacitor can be formed.

Figure 14A:
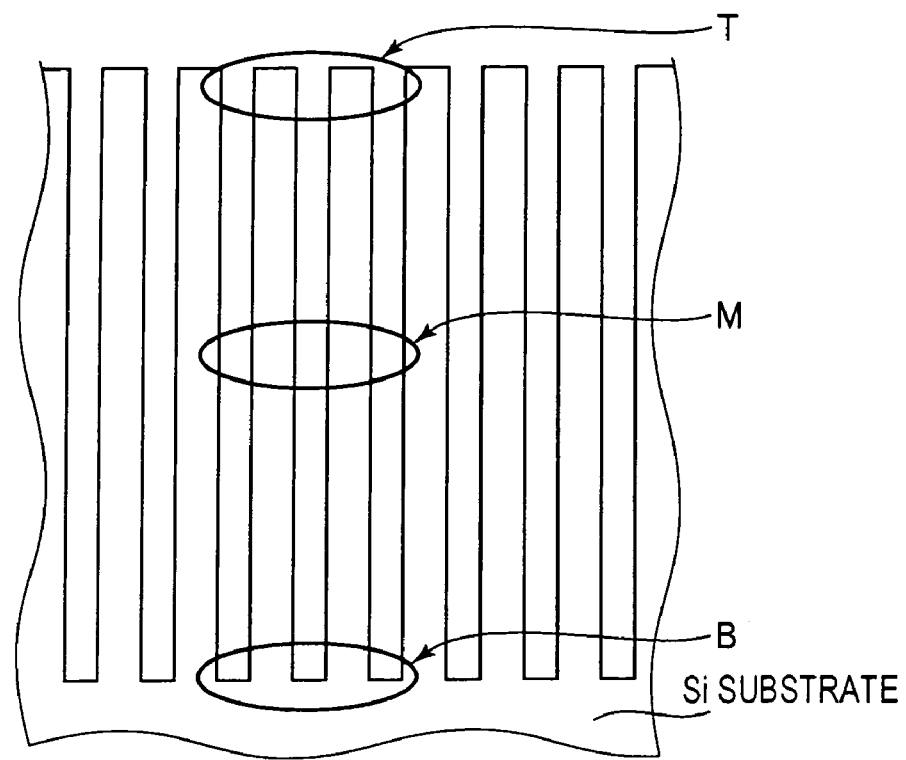
FIG. 14A and FIG. 14B are schematic views of a cross section of the wafer to illustrate measured portions.
Figure 14B:
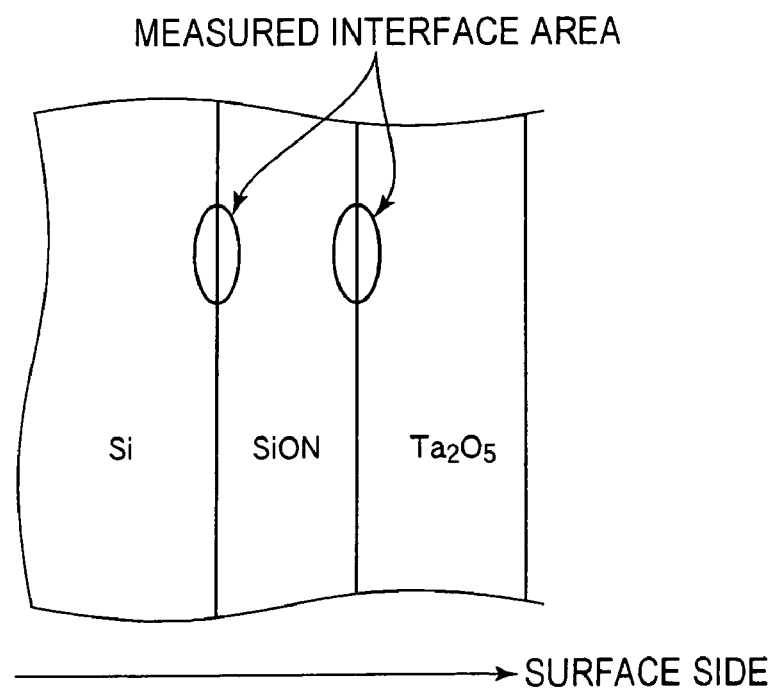

Next, results of experiments for confirming the effects of the present invention will be described. Using the plasma processing apparatus 100 shown in FIG. 10, simulation was conducted in which the nitridation processing was applied to a trench formed in a Si substrate of monocrystalline silicon to form a $Si_3N_4$ film, under varied process pressure. Thereafter, similarly to the manufacturing processes of the MIS capacitor, $Ta_2O_5$ was deposited by CVD and ozone-annealed under the condition of 425° C. In this sample, the nitridation degree was compared among portions of the trench. The shape of the trench on the Si substrate used in this experiment is shown in FIG. 14A and FIG. 14B. FIG. 14A shows a cross section of the Si substrate in which the trenches are formed. FIG. 14B is an enlarged view of an essential portion of its surface and shows a state in which a $Si_3N_4$ film is oxidized to be reformed into a SiON film. A width D of the trench was 0.25 μm and its aspect ratio (L/D) was about 30.

Two kinds of processing, namely, low-pressure processing under the process pressure of 6.7 (50 mTorr) and high-pressure processing under the process pressure of 400 Pa (3 Torr) were conducted. The other conditions in the plasma nitridation processing are as follows.
[Low-pressure condition (6.7 Pa)]
Flow rate of the process gas: $Ar/N_2$=1000/40 mL/min (sccm)
Process temperature: 400° C.
Supply power to plasma: 1.0 kW
Formed film thickness: 1.5 nm or 2.0 nm
[High-pressure condition (400 Pa)]
Flow rate of the process gas: $Ar/N_2$=1000/100 mL/min (sccm)
Process temperature: 400° C.
Supply power to plasma: 2.0 kW
Formed film thickness: 1.5 nm As shown in FIG. 14A, the existence of N in interface areas was analyzed by EELS (Electron Energy-Loss Spectroscopy) in three places of the trench, namely, a top T (depth at which the aspect ratio is about 2), a middle M (depth at which the aspect ratio is about 15), and a bottom B (depth at which the aspect ratio is about 30). As shown in FIG. 14B, an interface between the Si layer and the SiON film (Si/SiON interface) and an interface between the SiON film and $Ta_2O_5$ layer (SiON/TaO interface) were defined as the interface areas.

Figure 15:
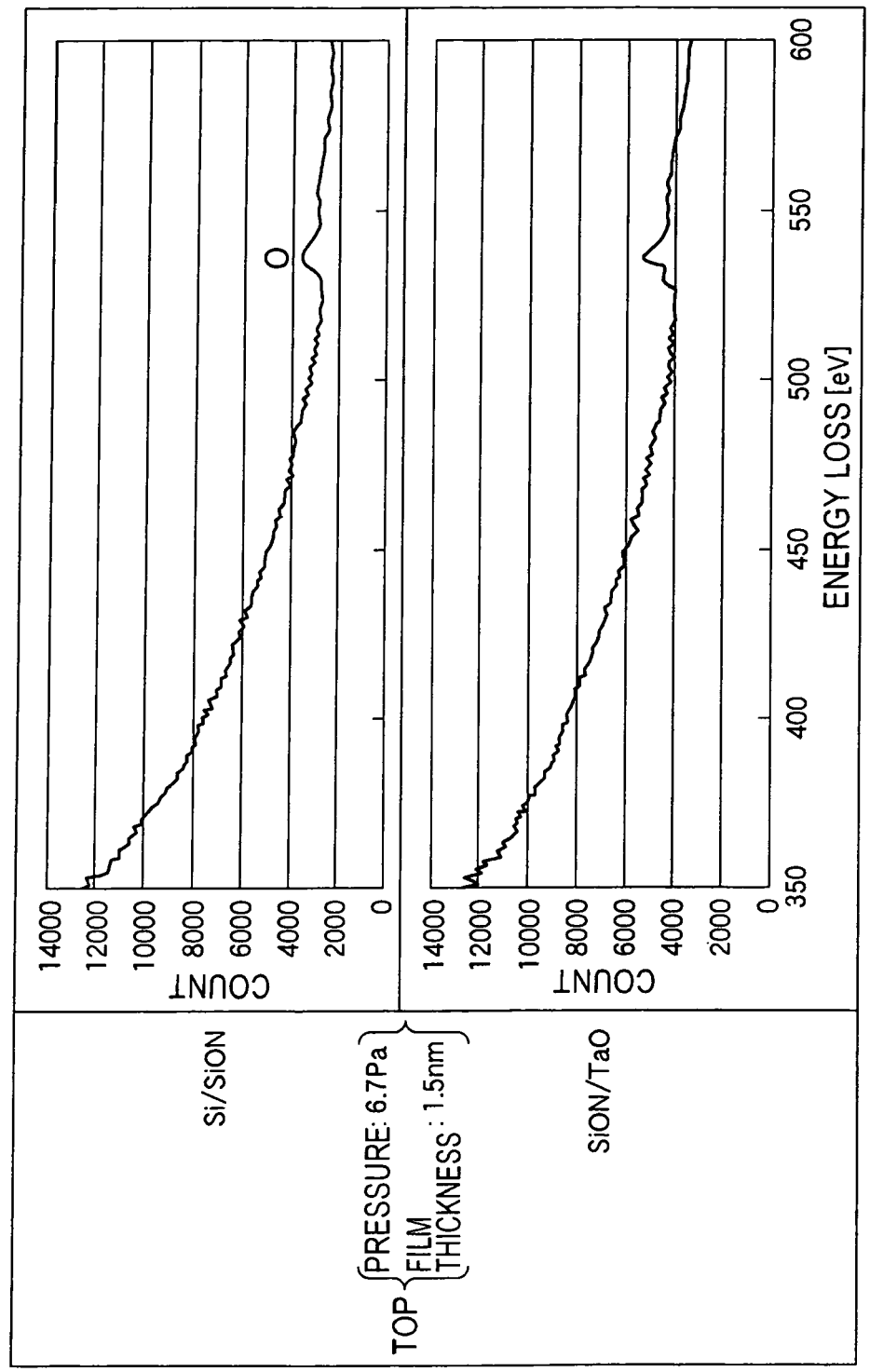
FIG. 15 is a chart showing results of detecting N at tops of interfaces by EELS after low-pressure processing is performed to form a 1.5 mm thick nitride film.
Figure 16:
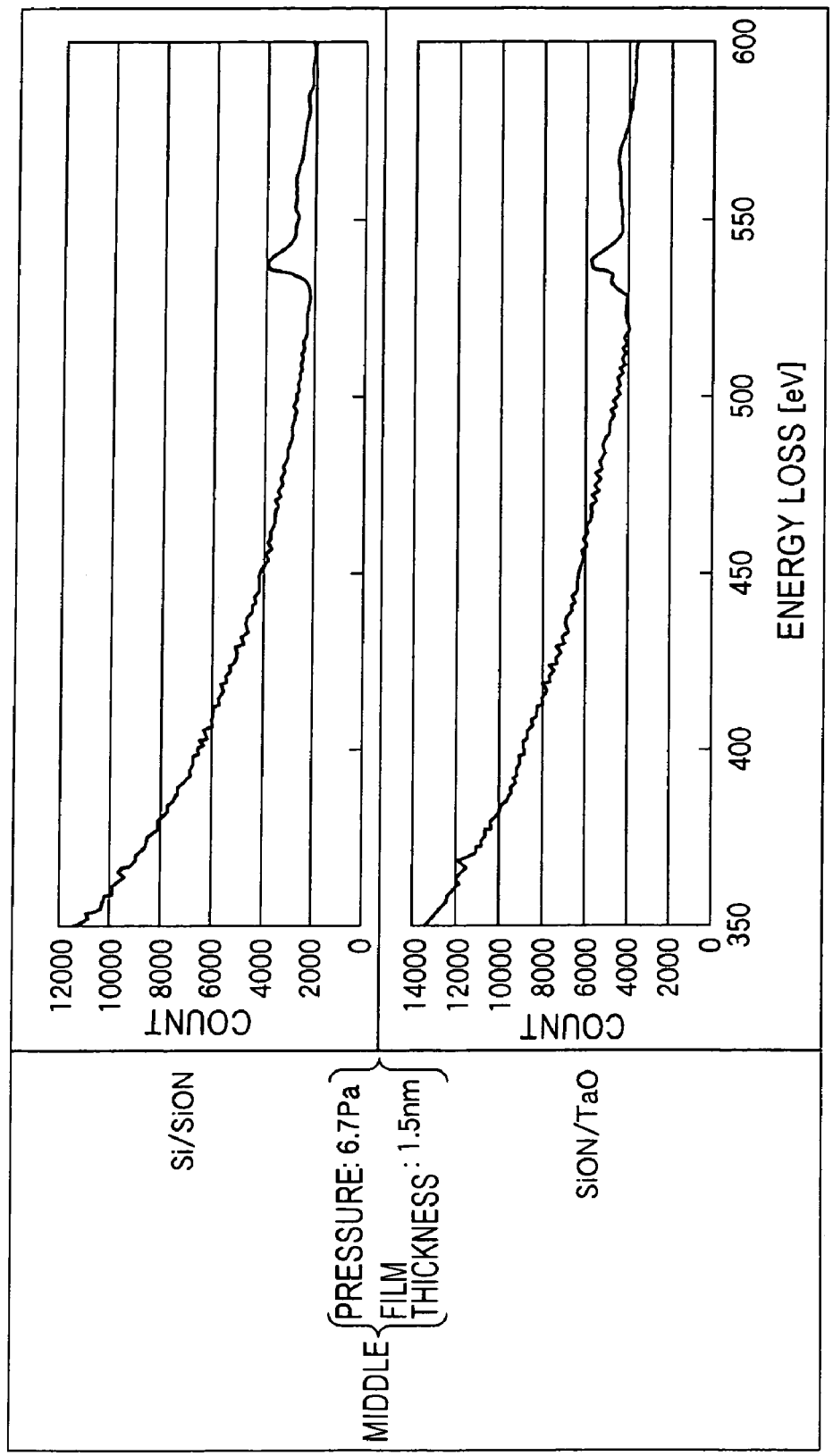
FIG. 16 is a chart showing results of detecting N at middles of the interfaces by EELS after the low-pressure processing is performed to form the 1.5 mm thick nitride film.
Figure 17:
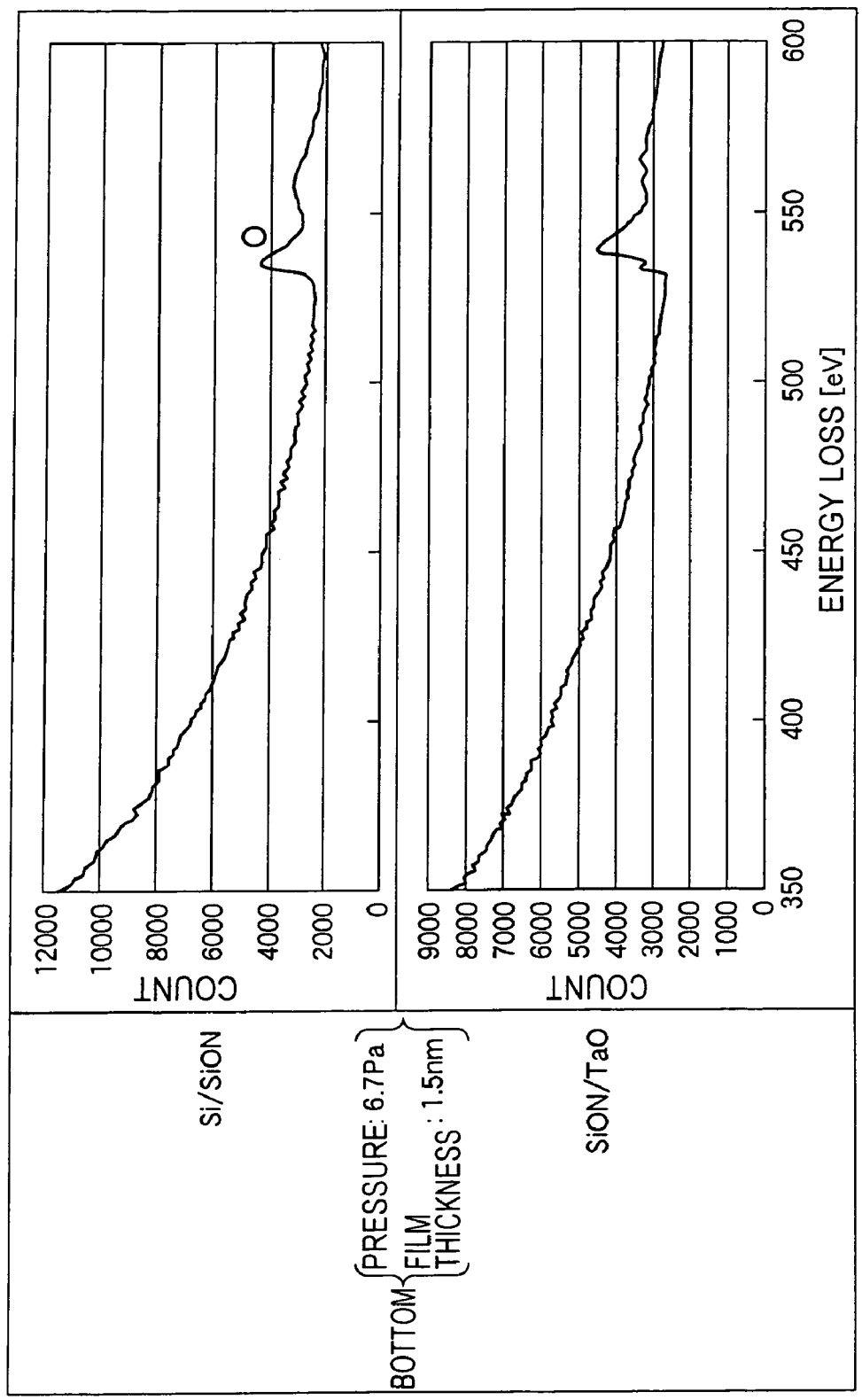
FIG. 17 is a chart showing results of detecting N at bottoms of the interfaces by EELS after the low-pressure processing is performed to form the 1.5 mm thick nitride film.

FIG. 15, FIG. 16, and FIG. 17 respectively show the results of the analysis on the interfaces at the top T, the middle M, and the bottom B of the sample having undergone the nitridation processing by the low-pressure processing (6.7 Pa) with a 1.5 nm film thickness.

Figure 18:
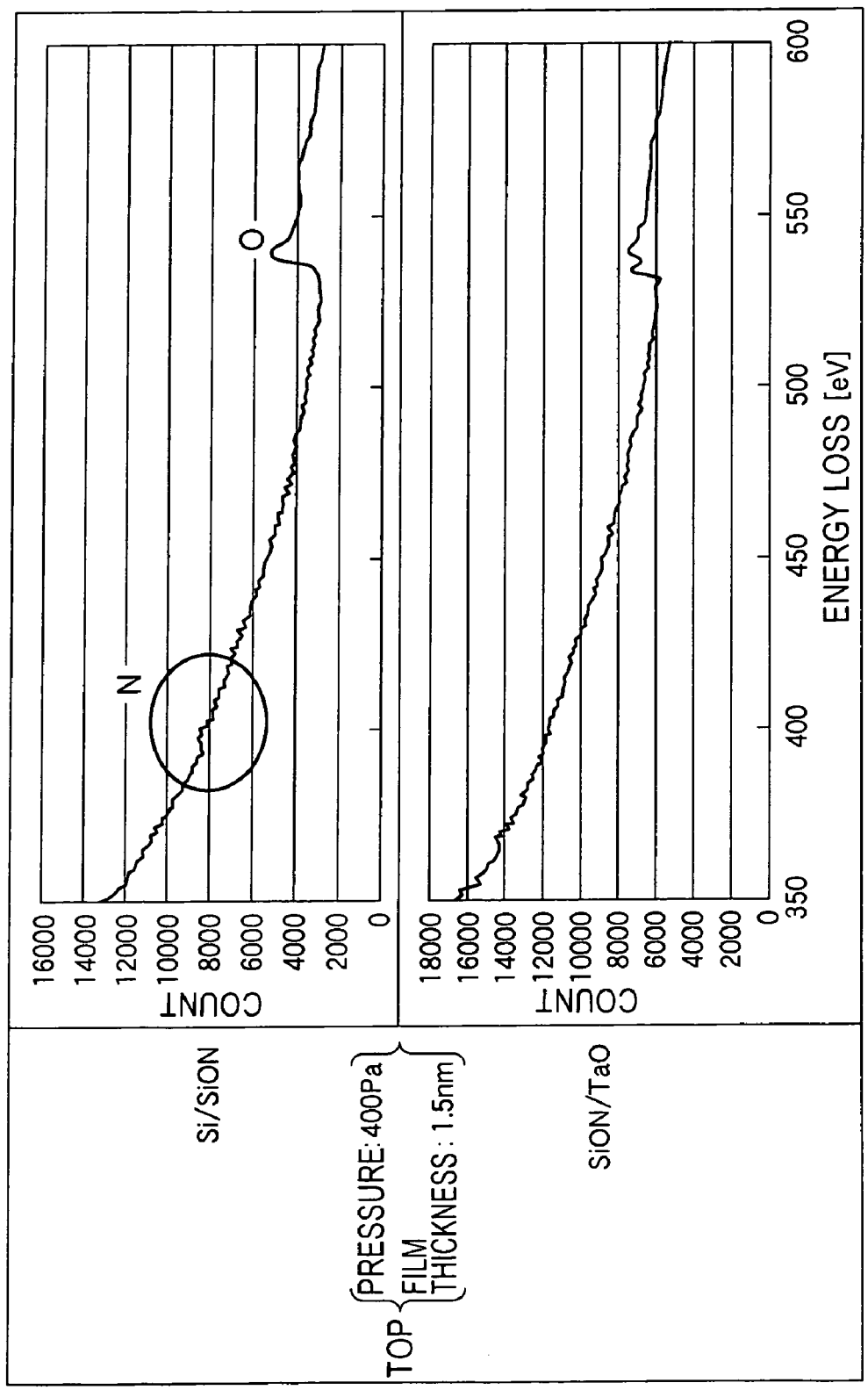
FIG. 18 is a chart showing results of detecting N at the tops of the interfaces by EELS after high-pressure processing is performed to form a 1.5 mm thick nitride film.
Figure 19:
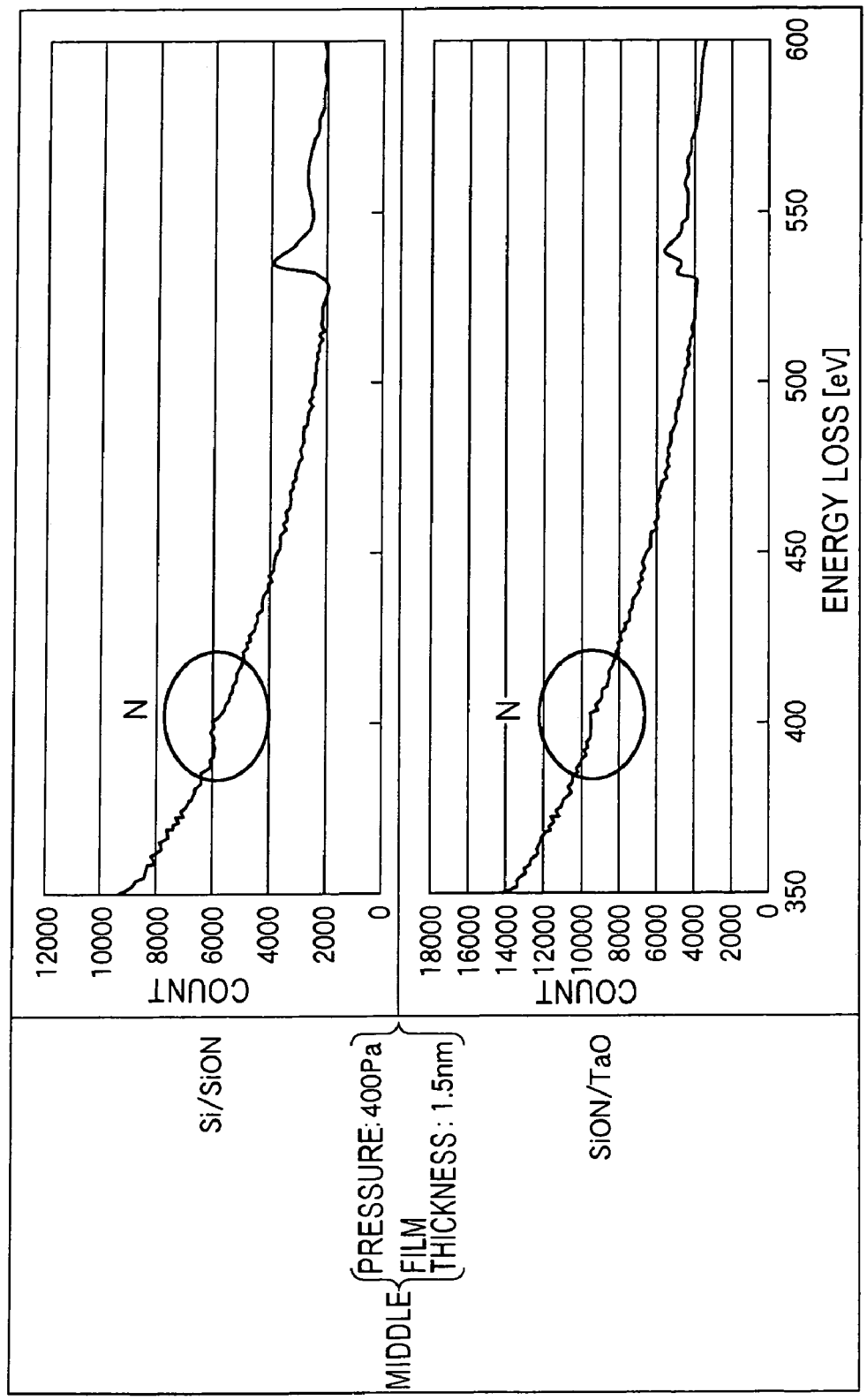
FIG. 19 is a chart showing results of detecting N at the middles of the interfaces by EELS after the high-pressure processing is performed to form the 1.5 mm thick nitride film.
Figure 20:
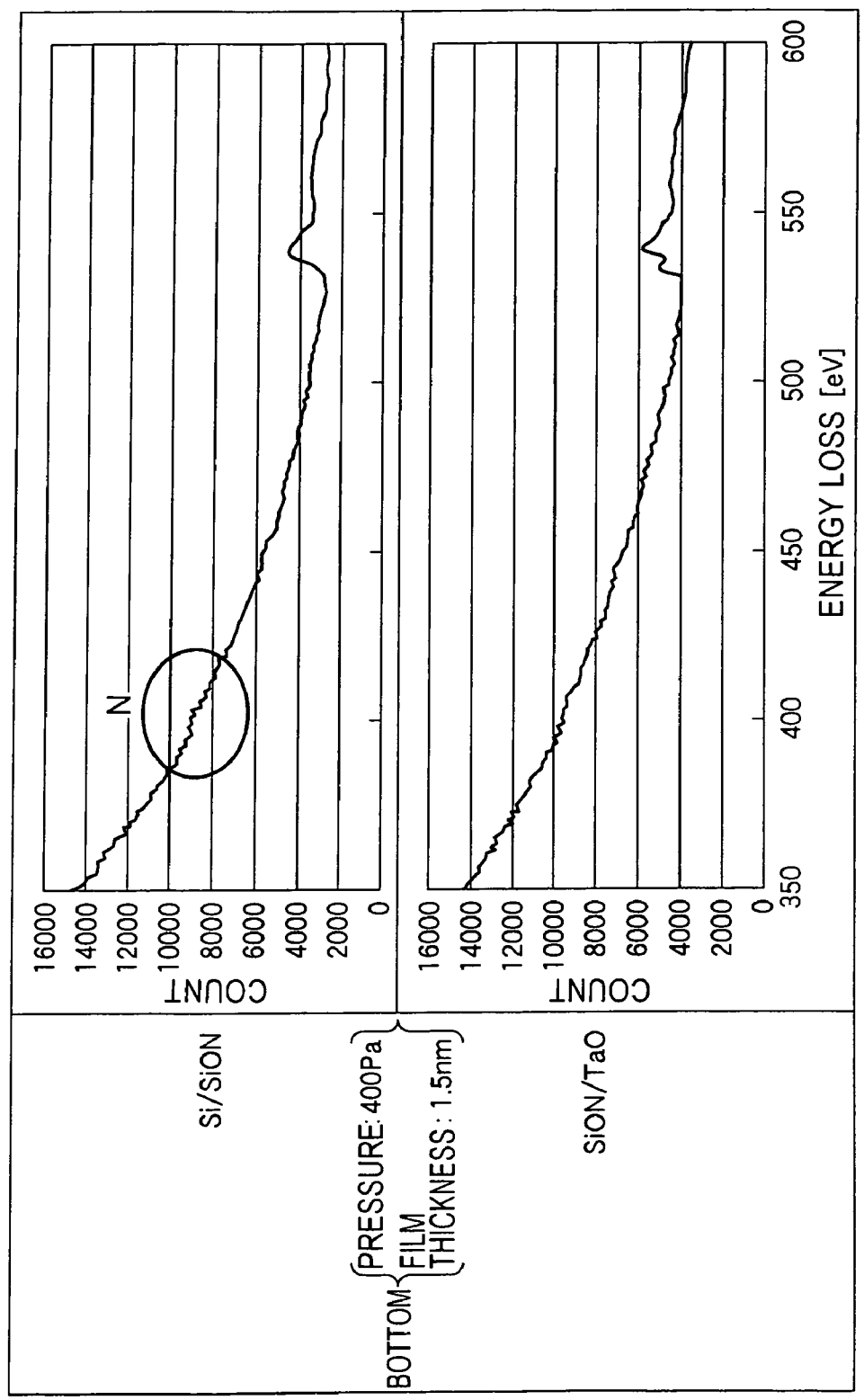
FIG. 20 is a chart showing results of detecting N at the bottoms of the interfaces by EELS after the high-pressure processing is applied to form the 1.5 mm thick nitride film.

Further, FIG. 18, FIG. 19, and FIG. 20 respectively show the results of the analysis on the interfaces at the top T, the middle M, and the bottom B of the sample having undergone the nitridation processing by the high-pressure processing (400 Pa) with a 1.5 nm film thickness.

From the results shown in FIG. 15 to FIG. 17, no existence of N was detected on the Si/SiON interface in the case of the low-pressure processing (6.7 Pa). Since the Si/SiON interface should be a depth corresponding to the thickness of the nitride film, the existence of N should be detected at all of the top T, the middle M, and the bottom B if the nitridation was uniform. Therefore, it was thought that uniform deposition of the nitride film was difficult under the low-pressure condition (6.7 Pa) even when the plasma processing apparatus 100 was used.

On the other hand, in the case of the high-pressure processing, as shown in FIG. 18 to FIG. 20, N was detected on the Si/SiON interface at the three measured places (the top T, the middle M, and the bottom B), and thus it was confirmed that the nitridation proceeded with a sufficient film thickness. A possible reason for the detection of little N on the SiON/TaO interface is that the oxidation proceeds from $Ta_2O_5$ side due to the deposition of $Ta_2O_5$ and the $O_3$ annealing after Si was nitrided, and N concentration became equal to a detection limit or lower.

Figure 21:
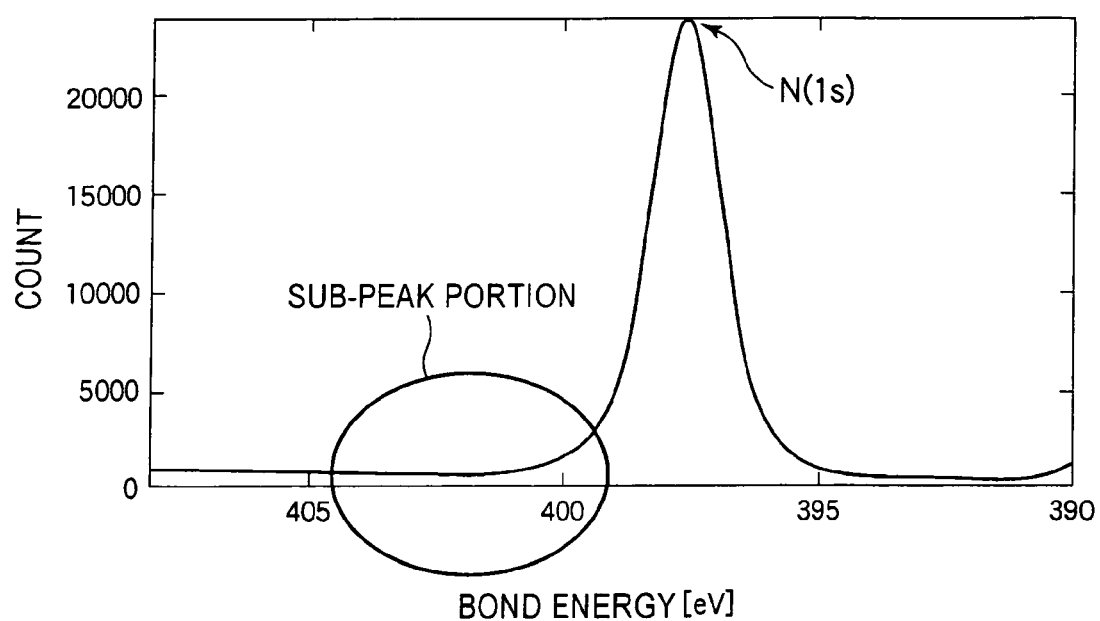
FIG. 21 is a chart showing results of analysis of a $Si_3N_4$ film by XPS analysis.

FIG. 21 shows a profile of N(1S) obtained by an X-ray photoelectron spectroscopy (XPS) of a silicon nitride film ($Si_3N_4$) which is formed on a Si substrate under the aforesaid high-pressure condition by using the plasma processing apparatus 100 in FIG. 10. It has been confirmed from FIG. 21 that a high-purity, high-quality silicon nitride film can be formed since no sub-peak is detected.

Further, a semiconductor device including a MIS capacitor having the same structure as that in FIG. 12 was manufactured and a C-V characteristic was measured. As a result, it was confirmed that capacitance was improved from 22.7 [pF] to 27 [pF] when a silicon nitride film was formed under the aforesaid high-pressure condition by using the plasma processing apparatus 100 in FIG. 10, compared with a case where the silicon nitride film was not formed.

In the foregoing, the embodiments of the present invention are described, but the present invention is not limited to the above-described embodiments and various modifications can be made.

For example, instead of the polysilicon film 202 in FIG. 12 and FIGS. 13A to 13C, a polysilicon film on which a HSG (Hemispherical Grained) layer is formed may be a processing target as the lower electrode. Further, the method of the present invention is applicable not only to the manufacturing processes of a memory cell of a semiconductor device such as a DRAM but also to manufacture of liquid crystal devices and the like and various kinds of semiconductor devices such as a compound semiconductor, which requires the nitridation of silicon, for example, to a case where a surface of a FG-poly (a polysilicon layer of a floating gate) of a flash memory is nitrided.

The present invention is capable of manufacturing a thin-film capacitor without lowering capacity and thus is advantageous in manufacture of a semiconductor device, for example, a DRAM.

In the foregoing, the embodiments and examples are described based on several instances, but the present invention is not limited to these embodiments, and can be modified within a range of the technical idea shown in the claims.

What is claimed is:

1. A manufacturing method of a semiconductor device, comprising the steps of:
   forming a lower electrode made of titanium nitride for a capacitor on a semiconductor substrate;
   forming a nitrogen-rich layer by applying further nitridation processing to a surface of the lower electrode made of said titanium nitride;
   forming an insulating film on the lower electrode; and
   forming an upper electrode on the insulating film.

2. The manufacturing method of the semiconductor device according to claim 1,
   wherein said nitridation processing of the lower electrode is plasma processing.

3. The manufacturing method of the semiconductor device according to claim 2,
   wherein the plasma processing is carried out under a reduced pressure of 1 Pa to 665 Pa or lower.

4. A plasma nitridation method of nitriding a polysilicon film exposed on a surface of a processing target, by a nitrogen-containing plasma,
   wherein plasma nitridation processing is applied to the polysilicon film by a plasma processing apparatus that generates the plasma by introducing a microwave into a process chamber, using a plane antenna having a plurality of slots, and
   wherein the plasma nitridation processing is applied under process pressure of 66.7 Pa to 1333 Pa and process temperature of 250° C. to 800° C.

5. The plasma nitridation method according to claim 4, wherein the process pressure is 133.3 Pa to 666.5 Pa.

6. The plasma nitridation method according to claim 4, wherein the nitrogen-containing plasma contains at least 5% nitrogen or more.

7. The plasma nitridation method according to claim 4, wherein the nitrogen-containing plasma is a plasma generated by gas that contains nitrogen gas and rare gas.

8. The plasma nitridation method according to claim 4, wherein a thickness of a nitride film formed on the polysilicon film is 0.5 nm to 3 nm.

9. The plasma nitridation method according to claim 4, wherein the polysilicon film on the surface of the processing target has a shape with a recessed portion.

10. The plasma nitridation method according to claim 9, wherein a ratio of depth and opening width of the recessed portion is 1 to 100.

11. The plasma nitridation method according to claim 4, wherein the polysilicon film is a lower electrode of a MIS capacitor.

* * * * *